United States Patent
Yamauchi

(10) Patent No.: US 6,871,338 B2
(45) Date of Patent: Mar. 22, 2005

(54) SEMICONDUCTOR INTEGRATED CIRCUIT DEVICE AND METHOD FOR DESIGNING THE SAME

(75) Inventor: Hiroyuki Yamauchi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 199 days.

(21) Appl. No.: 10/281,300

(22) Filed: Oct. 28, 2002

(65) Prior Publication Data

US 2003/0088849 A1 May 8, 2003

(30) Foreign Application Priority Data

Nov. 5, 2001 (JP) ........................................ 2001-339024

(51) Int. Cl.[7] ............................................. G06F 17/50
(52) U.S. Cl. ......................................... 716/19; 716/21
(58) Field of Search .......................... 716/19–21; 430/5

(56) References Cited

U.S. PATENT DOCUMENTS

| | | | |
|---|---|---|---|
| 6,077,310 A | | 6/2000 | Yamamoto et al. |
| 6,282,696 B1 | * | 8/2001 | Garza et al. ................. 716/19 |
| 6,470,489 B1 | * | 10/2002 | Chang et al. ................. 716/21 |
| 6,553,559 B2 | * | 4/2003 | Liebmann et al. ............ 716/19 |
| 6,625,801 B1 | * | 9/2003 | Pierrat et al. ................. 716/19 |
| 2001/0023043 A1 | | 9/2001 | Futrell et al. |

* cited by examiner

Primary Examiner—Vuthe Siek
Assistant Examiner—Paul Dinh
(74) Attorney, Agent, or Firm—McDermott Will & Emery LLP

(57) ABSTRACT

A method for designing a semiconductor integrated circuit device, the method has the steps of producing, for a plurality of placement regions on each of which a design pattern is to be placed, first layout data having a first expected value based on a first layout design rule, producing, if a difference between the first expected data and an expected finished size after fabrication of the first layout data falls within an error tolerance for a standard value, first OPC data by correcting the first layout data, producing, if the plurality of placement regions include an out-of-tolerance region for which the first OPC data falling within the error tolerance cannot be produced, second layout data having a second expected value for the out-of-tolerance region based on a second layout design rule, producing second OPC data by correcting the second layout data such that an expected finished size after fabrication of the second layout data falls within the error tolerance for the standard value, and producing mask data by using the first OPC data and the second OPC data.

10 Claims, 27 Drawing Sheets

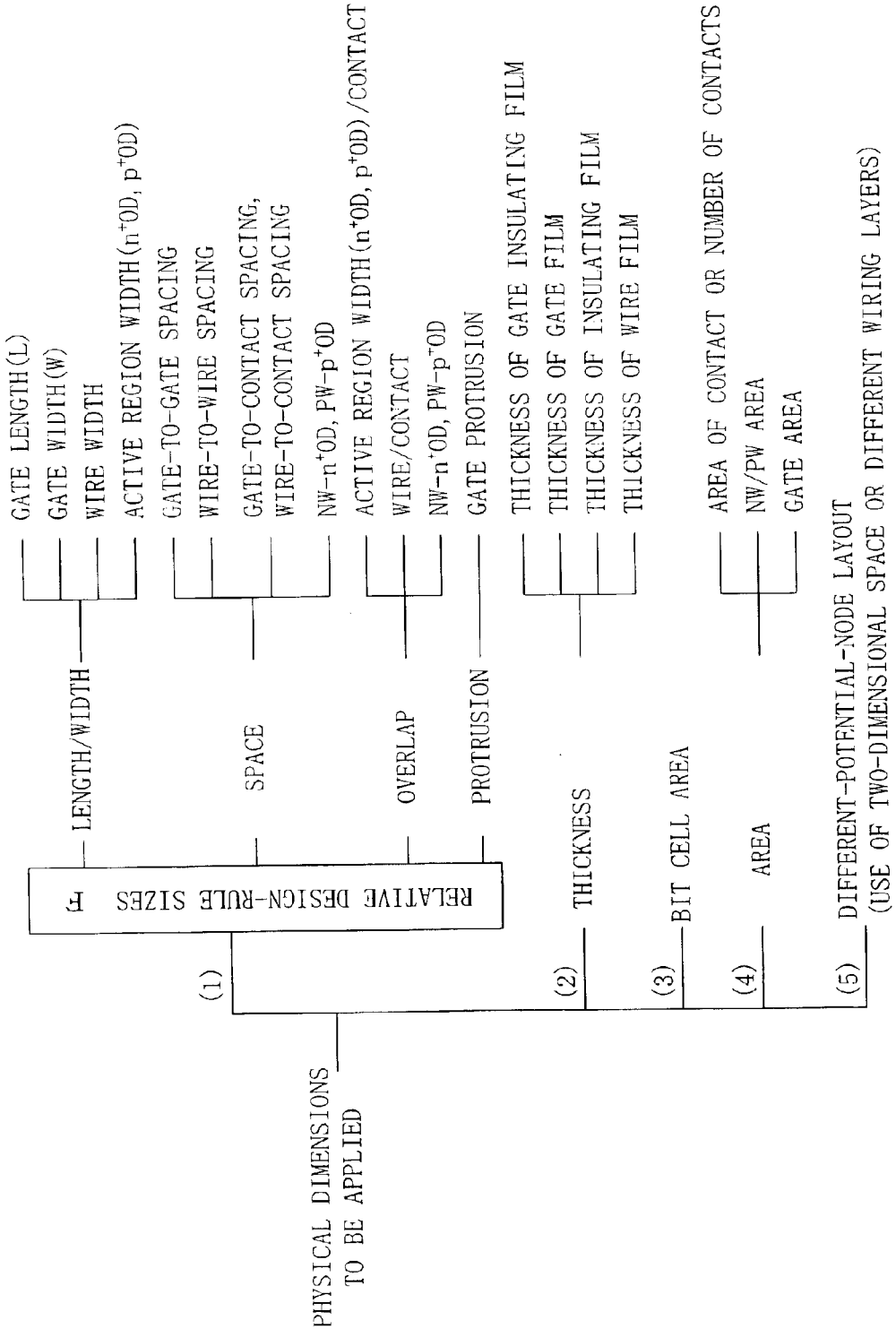

| PHYSICAL DIMENSIONS TO BE APPLIED | CONDITION TO BE APPLIED (FIRST GEOMETRIC FEATURE) |
|---|---|
| BIT CELL AREA ($\mu m^2$) (S_bitcell) | DIRECTION (GATE EXTENDS IN UNIFORM DIRECTION) |
| BIT-CELL AREA IN SRAM S_bitcell=2.4 S_bitcell=3.5 | MAIN GATES COMPOSING SRAM EXTENDS IN UNIFORM DIRECTION IN WHICH LITHOGRAPHY IS OPTIMIZED |

GATE LENGTH Lg=LONG

| PHYSICAL DIMENSIONS TO BE APPLIED | CONDITION TO BE APPLIED (FOURTH ELECTRIC SPECIFICATION) |
|---|---|
| BIT CELL AREA ($\mu m^2$) (S_bitcell) | MEMORY FUNCTION (WITH OR WITHOUT REDUNDANT FUNCTION) |
| BIT-CELL AREA IN SRAM S_bitcell=2.4 S_bitcell=3.5 | WHETHER OR NOT UNIT SRAM BLOCK HAS REDUNDANCY-RELIEF FUNCTION |

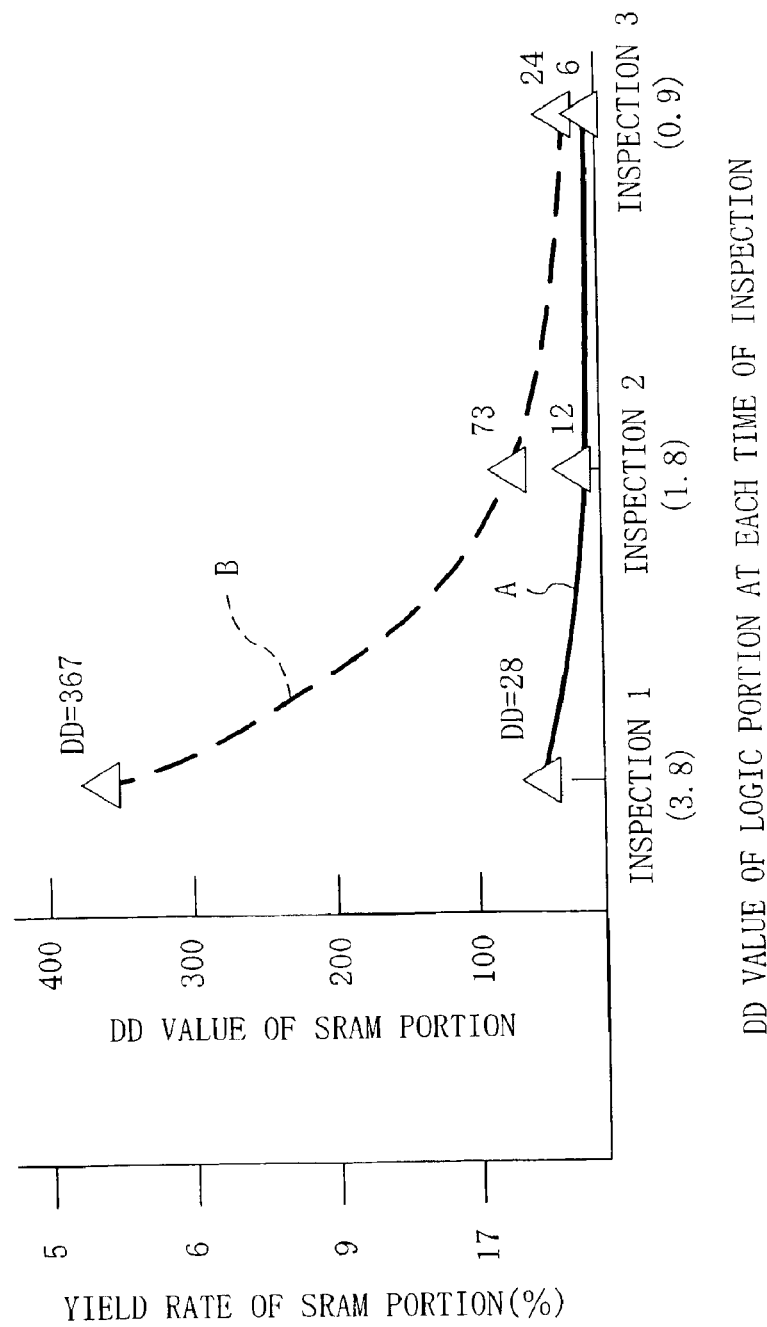

| PHYSICAL DIMENSIONS TO BE APPLIED | CONDITION TO BE APPLIED (FIRST USAGE MODE) |
|---|---|
| BIT CELL AREA ($\mu m^2$) (S_bitcell) | ONE BIT FAULT (POINT) IS TOLERABLE (EXCEPT FOR CONSECUTIVE FAULTS) |
| BIT-CELL AREA IN SRAM S_bitcell=2.4 | ONE BIT FAULT (POINT) IS TOLERABLE (EXCEPT FOR CONSECUTIVE FAULTS) GIVE HIGHER PRIORITY TO CAPACITY THAN TO POINT DEFECT |

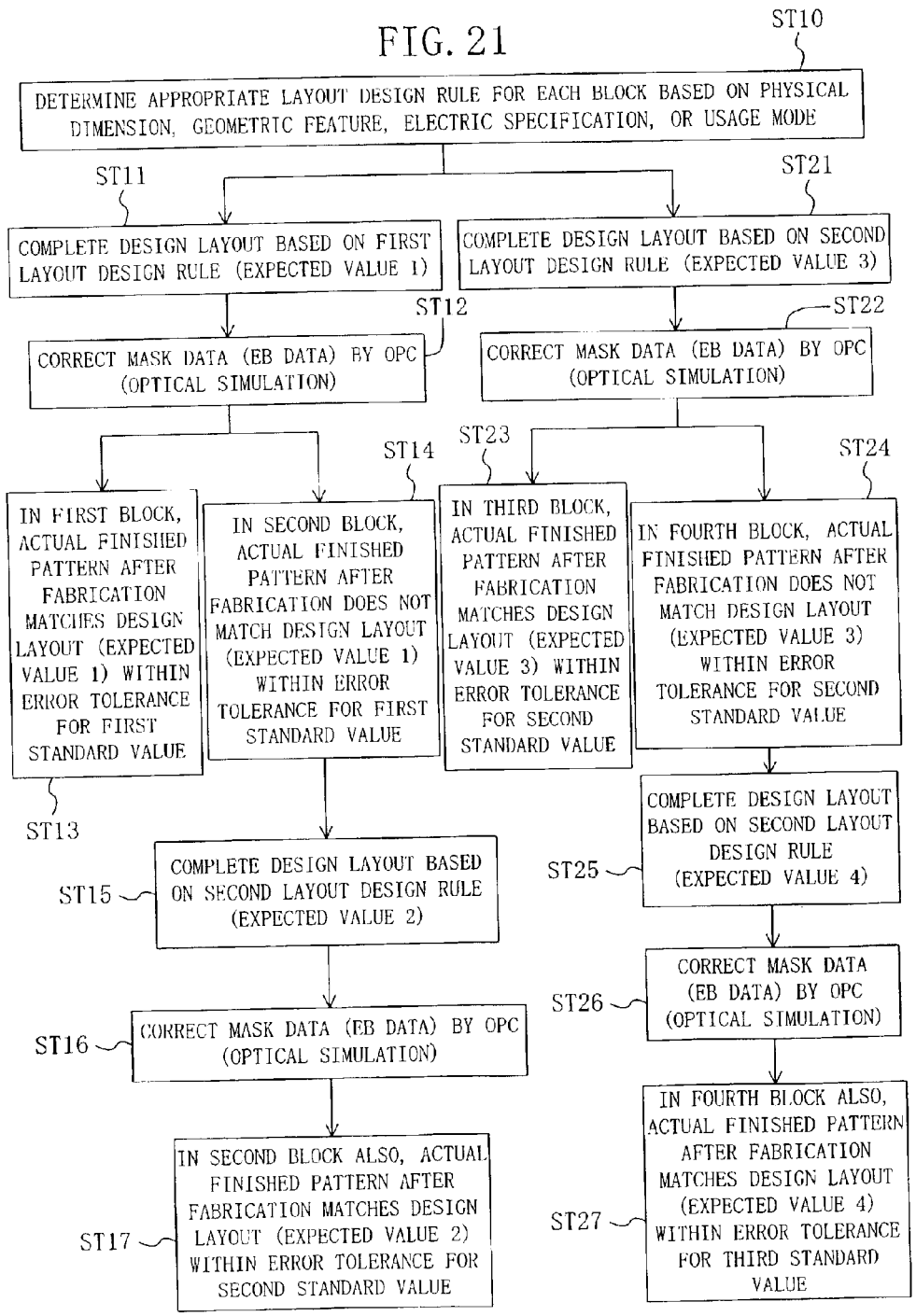

SEMICONDUCTOR INTEGRATED CIRCUIT DEVICE AND METHOD FOR DESIGNING THE SAME

BACKGROUND OF THE INVENTION

The present invention relates to a semiconductor integrated circuit device which matches the trend toward further miniaturization.

As shown in FIG. 27, a conventional method for designing a semiconductor integrated circuit device has produced layout data based on a design rule which is uniform throughout a chip. Layout data is uniquely determined such that the difference between an expected value and a finished physical size after patterning, each of which is based on the layout data, falls within an error tolerance for the expected value.

Specifically, if a chip surface includes a region for which first OPC (optical proximity correction) data falling within an error tolerance for a first standard value cannot be produced, second layout data based on a second layout design rule and having a second expected value is redetermined uniquely not only for the region but also for all placement regions, whereby the semiconductor integrated circuit device is redesigned. Here, second OPC data is produced by correcting the second layout data such that the difference between a second expected value and an expected finished size after patterning, each of which is based on the second layout data, falls within an error tolerance for the first standard value.

As design sizes are reduced increasingly year after year, however, a chip designing process performed by using one layout design rule for one chip encounters the following problems.

The layout design rule which is 0.13 $\mu$m in the year 2001 is expected to become 0.10 $\mu$m in the year 2005. If design is to be performed in accordance with the layout design rule of 0.10 $\mu$m, a fabrication process requires a patterning accuracy on the order of several tens of nanometers.

In that case, it will become extremely difficult to control variations in patterning accuracy to several tens of nanometers by considering each of variations in patterning accuracy in the fabrication process, which are dependent on the regions (portions) of the principal surface of a wafer, the relationship between the regions (portions) of one chip and layout densities therein, and the like.

If a design rule also considering variations in patterning accuracy is used, a design margin is reduced dramatically so that the yield rate is reduced significantly. As a consequence, the trend toward further miniaturization drastically increases the manufacturing cost for a chip.

SUMMARY OF THE INVENTION

In view of the foregoing problems expected, an object of the present invention is to positively match the trend toward a further reduction in design size.

To attain the object, the present invention provides a method for designing a semiconductor integrated circuit device wherein, if a plurality of regions on which design patterns are to be placed include an out-of-tolerance region in which a finished size of the design pattern does not fall within an error tolerance for an expected value of layout data, a layout design rule different from that applied to within-tolerance regions is produced for the out-of-tolerance region or a standard value for the error tolerance different from that used in the within-tolerance regions is provided.

A first method for designing a semiconductor integrated circuit device according to the present invention comprises: a first step of producing, for a plurality of placement regions on each of which a design pattern is to be placed, first layout data having a first expected value based on a first layout design rule; a second step of producing, if a difference between the first expected data and an expected finished size after fabrication of the first layout data falls within an error tolerance for a standard value, first OPC data by correcting the first layout data; a third step of producing, if the plurality of placement regions include an out-of-tolerance region for which the first OPC data falling within the error tolerance cannot be produced, second layout data having a second expected value for the out-of-tolerance region based on a second layout design rule; a fourth step of producing second OPC data by correcting the second layout data such that an expected finished size after fabrication of the second layout data falls within the error tolerance for the standard value; and a fifth step of producing mask data by using the first OPC data and the second OPC data.

In accordance with the first method for designing a semiconductor integrated circuit device, the layout design rule is not applied equally to all the plurality of placement regions but the second design rule different from the first design rule is applied to the region (out-of-tolerance region) where the error tolerance for the standard value of the first layout design rule is not satisfied. Since the layout design rule considering even variations in patterning accuracy is not applied equally to all the plurality of placement regions, a design margin can be provided for each of the placement regions, which ensures the miniaturization of the integrated circuit device.

Preferably, the first method for designing a semiconductor integrated circuit device assumes that the plurality of placement regions are provided on one semiconductor substrate and further comprises the step of: prior to the first step, dividing a layout design rule in each of the placement regions into a plurality of layout design rules in accordance with a geometric condition placed on the design pattern on the semiconductor substrate, wherein the first step includes the step of selecting the first layout design rule from among the plurality of layout design rules and the third step includes the step of selecting the second layout design rule from among the plurality of layout design rules.

Preferably, the first method for designing a semiconductor integrated circuit device assumes that the plurality of placement regions are provided on one base made of a semiconductor and further comprises the step of: prior to the first step, dividing a layout design rule in each of the placement regions into a plurality of layout design rules in accordance with an outer configuration of the base, wherein the first step includes the step of selecting the first layout design rule from among the plurality of layout design rules and the third step includes the step of selecting the second layout design rule from among the plurality of layout design rules.

Preferably, the first method for designing a semiconductor integrated circuit device further comprises: prior to the first step, the step of dividing a layout design rule in each of the placement regions into a plurality of layout design rules in accordance with different finished sizes resulting from a required electric specification and a method for implementing the required electric specification, wherein the first step includes the step of selecting the first layout design rule from among the plurality of layout design rules and the third step includes the step of selecting the second layout design rule from among the plurality of layout design rules.

Preferably, the first method for designing a semiconductor integrated circuit device further comprises: prior to the first step, dividing a layout design rule in each of the placement regions in accordance with a required specification which differs depending on a usage mode of the semiconductor integrated circuit device, wherein the first step includes the step of selecting the first layout design rule from among the plurality of layout design rules and the third step includes the step of selecting the second layout design rule from among the plurality of layout design rules.

A second method for designing a semiconductor integrated circuit device comprises: a first step of producing, for a plurality of placement regions on each of which a design pattern is to be placed, first layout data having a first expected value based on a first layout design rule; a second step of producing, if a difference between the first expected data and an expected finished size after fabrication of the first layout data falls within an error tolerance for a standard value, first OPC data by correcting the first layout data; a third step of producing, if the plurality of placement regions include an out-of-tolerance region for which the first OPC data falling within the error tolerance cannot be produced, second OPC data by correcting the first layout data in the out-of-tolerance region such that the corrected first layout data falls within an error tolerance for a second standard value; and a fourth step of producing mask data by using the first OPC data and the second OPC data.

In accordance with the second method for designing a semiconductor integrated circuit device, the layout design rule is not applied equally to all the plurality of placement regions but the second standard value different from the first standard value is applied to the region (out-of-tolerance region) where the error tolerance for the standard value of the first layout design rule is not satisfied. Since the layout design rule considering even variations in patterning accuracy is not applied equally to all the plurality of placement regions, a design margin can be provided for each of the placement regions, which ensures the miniaturization of the integrated circuit device.

Preferably, the second method for designing a semiconductor integrated circuit device assumes that the plurality of placement regions are provided on one semiconductor substrate and further comprises the step of: prior to the first step, dividing a standard value in each of the placement regions into a plurality of standard values in accordance with a geometric condition placed on the design pattern on the semiconductor substrate, wherein the first step includes the step of selecting the first standard value from among the plurality of standard values and the third step includes the step of selecting the second standard value from among the plurality of standard values.

Preferably, the second method for designing a semiconductor integrated circuit device assumes that the plurality of placement regions are provided on one base composed of a semiconductor and further comprises the step of: prior to the first step, dividing a standard value in each of the placement regions into a plurality of standard values in accordance with an outer configuration of the base, wherein the first step includes the step of selecting the first standard value from among the plurality of standard values and the third step includes the step of selecting the second standard value from among the plurality of standard values.

Preferably, the second method for designing a semiconductor integrated circuit device further comprises the step of: prior to the first step, dividing a standard value in each of the placement regions into a plurality of standard values in accordance with different finished sizes resulting from a required electric specification and a designing method for implementing the required electric specification, wherein the first step includes the step of selecting the first standard value from among the plurality of standard values and the third step includes the step of selecting the second standard value from among the plurality of standard values.

Preferably, the second method for designing a semiconductor integrated circuit device further comprises the step of: prior to the first step, dividing a standard value in each of the placement regions into a plurality of standard values in accordance with a required specification which differs depending on a usage mode of the semiconductor integrated circuit device, wherein the first step includes the step of selecting the first standard value from among the plurality of standard values and the third step includes the step of selecting the second standard value from among the plurality of standard values.

BRIEF DESCRIPTION OF THE DRAWINGS

FIG. 3 shows a category system of physical dimensions (physical dimensions to be applied) to be applied to the design patterns composing the semiconductor integrated circuit device;

FIGS. 6A and 6B show plan structures of bit cells contained in an SRAM block formed in a semiconductor integrated circuit device according to EXAMPLE 2 of EMBODIMENT 1, of which FIG. 6A is a plan view when two contacts are provided in a specified region and FIG. 6B is a plan view when one contact is provided in a specified region;

FIGS. 11A and 11B show an SRAM block formed in a semiconductor integrated circuit device according to EXAMPLE 1 of EMBODIMENT 2 of the present invention, of which FIG. 11A is a partial circuit diagram of the SRAM block in which current voltage control is performed and FIG. 11B is a plan view of bit cells contained in the SRAM block;

FIGS. 12A and 12B show an SRAM block formed in the semiconductor integrated circuit device according to EXAMPLE 1 of EMBODIMENT 2, of which FIG. 12A is a partial circuit diagram of the SRAM block in which current voltage control is performed and FIG. 12B is a plan view of bit cells contained in the SRAM block;

FIGS. 14A and 14B show structures of SRAM blocks according to EXAMPLE 7 of EMBODIMENT 2, of which FIG. 14A is a block diagram of an SRAM circuit having a redundancy function and FIG. 14B is a block diagram of an SRAM circuit not having a redundancy function;

FIG. 15 is a graph showing the relationship between the DD value of a logic portion and the DD value of the SRAM blocks according to EXAMPLE 7 of EMBODIMENT 2 at each time of inspection;

FIGS. 18A and 18B show an SRAM block formed in a semiconductor integrated circuit device according to EXAMPLE 2 of EMBODIMENT 3, of which FIG. 18A is a partial circuit diagram of the SRAM block in which power shutdown control is performed and FIG. 18B is a plan view of bit cells contained in the SRAM block;

FIGS. 19A and 19B show an SRAM block formed in a semiconductor integrated circuit device according to EXAMPLE 2 of EMBODIMENT 3, of which FIG. 19A is a partial circuit diagram of the SRAM block in which power shutdown control is not performed and FIG. 19B is a plan view of bit cells contained in the SRAM block;

FIGS. 20A and 20B show an SRAM block formed in a semiconductor integrated circuit device according to EXAMPLE 2 of EMBODIMENT 3, of which FIG. 20A is a partial circuit diagram of the SRAM block in which power shutdown control is not performed and FIG. 20B is a cross-sectional view of bit lines and ground lines in the SRAM block;

FIG. 21 is a flow chart illustrating a method for designing a semiconductor integrated circuit device according to EMBODIMENTS 4 to 6 of the present invention;

FIGS. 26A to 26C show an SRAM block formed in a semiconductor integrated circuit device according to EXAMPLE 5 of EMBODIMENT 4, of which FIG. 26A is a partial circuit diagram of the SRAM block in which power shutdown control is performed and FIGS. 26B and 26C are cross-sectional views of bit lines and ground lines in the SRAM block.

DETAILED DESCRIPTION OF THE INVENTION

EMBODIMENT 1

Figure 1:
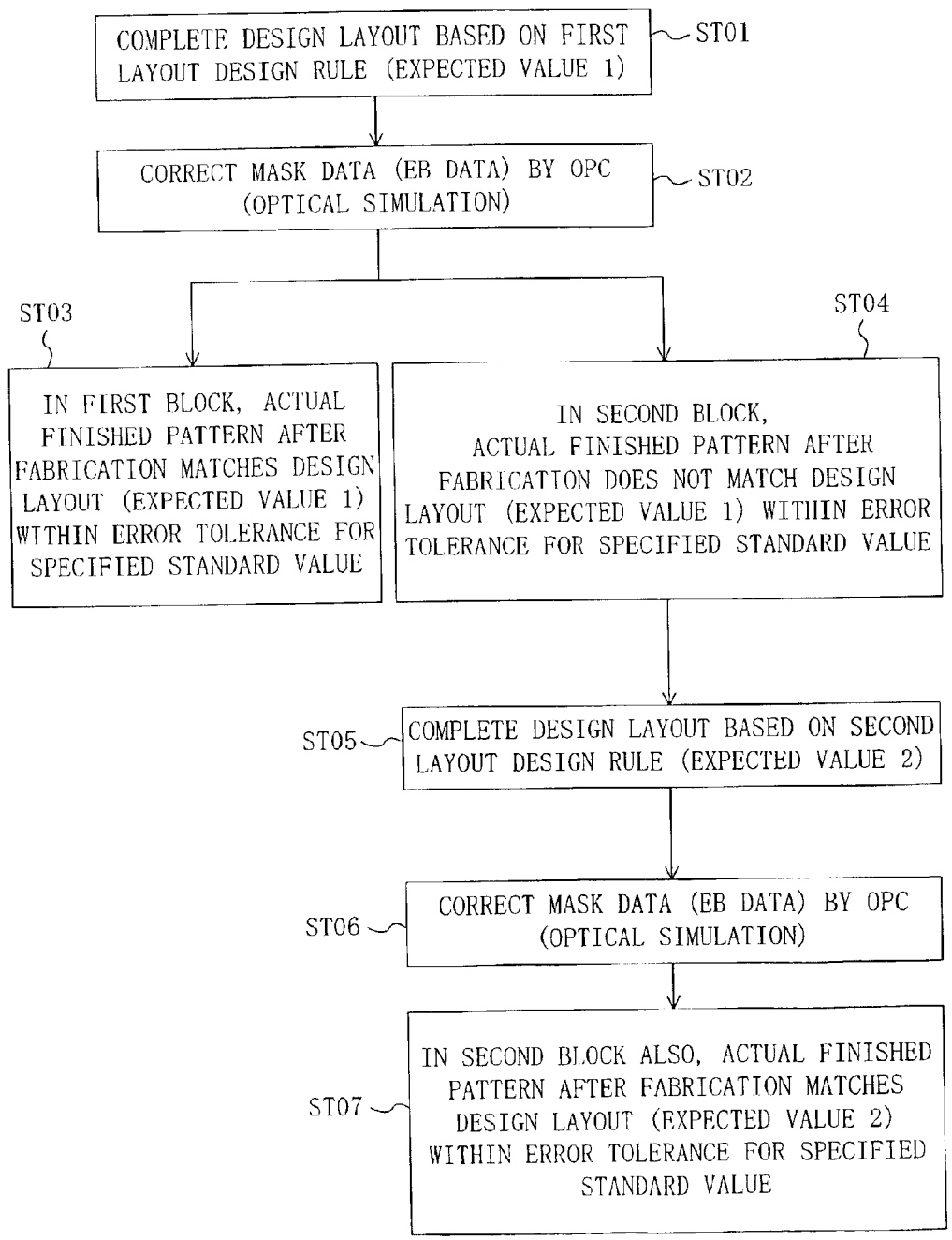
FIG. 1 is a flow chart illustrating a method for designing a semiconductor integrated circuit device according to each of first to third embodiments of the present invention.

Referring to the drawings, EMBODIMENT 1 of the present invention will be described.

FIG. 1 shows the flow of a method for designing a semiconductor integrated circuit device according to the present invention.

First, in a first-layout-data producing step ST01 shown in FIG. 1, first layout data having a first expected value based on a first design rule is produced for a plurality of placement (layout) regions which are provided on a single semiconductor substrate (chip) and on each of which a design pattern composed of an element pattern and a wiring pattern is to be placed. It is to be noted one placement region does not extend between a plurality of functional blocks.

Next, in a first-OPC-mask-data producing step ST02, the first layout data is optically corrected such that the difference between the first expected value and an expected finished size after fabrication, each of which is based on the first layout data, falls within an error tolerance for a standard value, whereby first OPC mask data composed of EB (exposure to electron beam) data is produced.

Next, in a first-OPC-mask-data determining step ST03, if the expected finished size after fabrication of the first layout data falls within the error tolerance for the standard value in each of the placement regions, the placement region is judged to be a within-tolerance region and the first OPC mask data is determined as mask data for exposure. In this case, however, the difference between the first expected value and the expected finished size after fabrication, each of which is based on the first layout design rule, does not necessarily falls within the error tolerance for the standard value throughout all the plurality of placement regions.

It is therefore determined in an out-of-tolerance-region determining step ST04 whether the plurality of placement regions include one in which the first OPC mask data does not fall within the error tolerance for the standard value, i.e., an out-of-tolerance region.

If there is the out-of-tolerance region, second layout data having a second expected value based on a second layout design rule different from the first layout design rule is produced subsequently for the out-of-tolerance region in a second-layout-data producing step ST05.

Next, in a second-OPC-mask-data producing step ST06, second OPC mask data composed of EB data is produced by optically correcting the second layout data such that an expected finished size after fabrication of the second layout data falls within an error tolerance for a standard value.

Next, in a second-mask-data determining step ST07, if the expected finished size after fabrication of the second layout data falls within the error tolerance for the standard value in the out-of-tolerance region, the out-of-tolerance region is judged to be a within-tolerance region and the second OPC mask data is determined as mask data for exposure.

Subsequently, mask data is produced by using the first OPC data and the second OPC data each of which has been determined.

If the difference between the second OPC mask data produced for the out-of-tolerance region and the expected finished size after fabrication does not fall within the error tolerance for the standard value in the second-OPC-mask-data producing step ST06, it is also possible to repeat the procedure by, e.g., producing third OPC mask data by using a third layout design rule.

For achieving further miniaturization in accordance with the conventional method for designing a semiconductor integrated circuit described above, there are only two approaches left, which are shown below:

(1) One approach is a uniform reduction in an amount of design margin considering variations in micro-patterning. This causes a significant reduction in yield rate but implements a semiconductor integrated circuit device having desired performance with a given probability;

(2) The other approach is the retention of a design margin considering variations in micro-patterning. This prevents a significant reduction in yield rate but does not provide a semiconductor integrated circuit device having desired performance so that the trend toward a semiconductor integrated circuit device higher in performance and smaller in size stagnates drastically.

Figure 2:
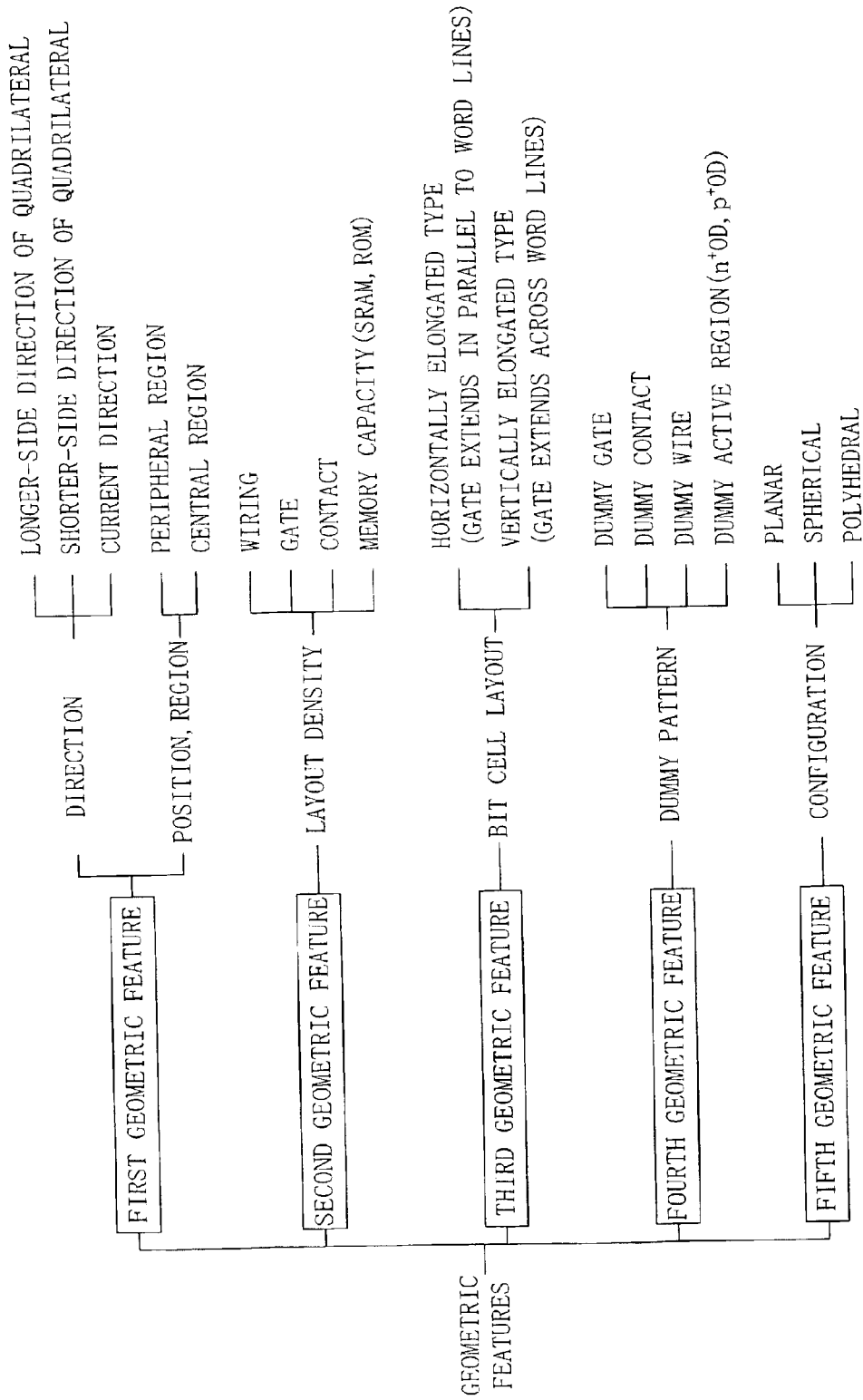
FIG. 2 shows a category system of geometric features in design patterns composing the semiconductor integrated circuit.

To implement the approaches, EMBODIMENT 1 performs optical simulation based on the regions (portions) of one semiconductor substrate (chip) or on the dependence of design patterns on the geometric features, which are shown in FIG. 2, in the first OPC-mask-data producing step ST02 and thereby produces the first OPC mask data such that the expected size after micro-patterning falls within a specified error tolerance for a desired layout pattern.

Subsequently, if there is an out-of-tolerance region which does not fall within the error tolerance in the out-of-tolerance-region judging step ST04, physical dimensions as shown in FIG. 3 are changed only for the out-of-tolerance region in the second-layout-data producing step ST05 so that the second OPC mask data is produced.

It has been conventional practice to entirely replace the first OPC mask data with the second OPC mask if the first OPC mask data does not fall within the error tolerance in at least one of the plurality of placement regions. By contrast, EMBODIMENT 1 produces the second OPC mask data such that it falls within the error tolerance only in the out-of-tolerance region of the first OPC mask data. This surely achieves miniaturization in, e.g., the placement regions using the first OPC mask data.

As shown in FIG. 2, EMBODIMENT 1 has grouped the geometric features of a design pattern and a semiconductor member (base) into five categories.

The first category is the longer-side or shorter-side direction of a design pattern having a plan quadrilateral configuration, such as a gate pattern, on a substrate or a position (region) at which the design pattern is placed on a chip. The second category is the layout densities of a wiring pattern, a gate pattern, and a contact pattern. The third category is the layout of a gate pattern composing cells (bit cells) composing one bit of a memory element. The fourth category is a dummy pattern for the design pattern such as a dummy gate pattern. The fifth category is an outer configuration of a semiconductor member onto which the design pattern is transferred.

As shown in FIG. 3, layout design rule values are obtained by grouping physical dimensions to be applied into five categories. In EMBODIMENT 1, the first, third, and fourth ones of the five categories will be described.

The first one of the physical dimensions to be applied is relative design-rule sizes in a layout design process. The relative design-rule sizes are a set of design patterns directly proportional to the square of an F value representing an inverse number of an aperture ratio. For example, the relative rule-sizes of the circuit elements include the lengths and widths of the parts of the circuit elements, the space (spacing) between the parts, an overlap (overlapping portion) between the parts, and the configurations of the protruding portions of the parts. The relative design-rule sizes of the wires are the widths of the wires or the space between the wires.

If the circuit elements are assumed to be field-electric transistors (FETs), the lengths or widths of the parts can be subdivided into gate lengths, gate widths, and the widths of active regions ($n^+OD$, $p^+OD$). The width of an active region (OD: Oxide Definition) in a FET indicates a width in the gate width direction in source/drain regions.

The space between the parts can be subdivided into a gate-to-gate spacing, a gate-to-contact spacing, a wire-to-contact spacing, a spacing between an n-type well (NW) and an n-type active region, and a spacing between a p-type well (PW) and a p-type active region.

The protrusions include, e.g., the size of a protruding portion from the gate.

The design-rule values used herein are not necessarily the sizes of a mask and indicate actual finished sizes (expected values) after process patterning.

The third category is, if the design pattern is for, e.g., bit cells, an area allowed for each of the bit cells in laying out the bit cells in the layout design process, i.e., a bit cell area.

The fourth category is areas occupied by the design patterns on the substrate. If contacts providing electric connections between the circuit elements contained in the element formation layer and the wires contained in the wiring layer are taken as an example, the fourth category is the layout area of the contacts or the number of the contacts occupying the layout area. Otherwise, the fourth category is areas occupied by n-type wells and p-type wells or areas occupied by the gates of FETs.

EXAMPLE 1 OF EMBODIMENT 1

A description will be given herein below to the case where "Shorter-Side Direction (gate length) of Quadrilateral" as "Direction", which is the first geometric feature, is applied to "Relative Design-Rule Sizes" and "Bit Cell Area" which are the first and third categories of the physical dimensions.

Figures 4A, 4B:
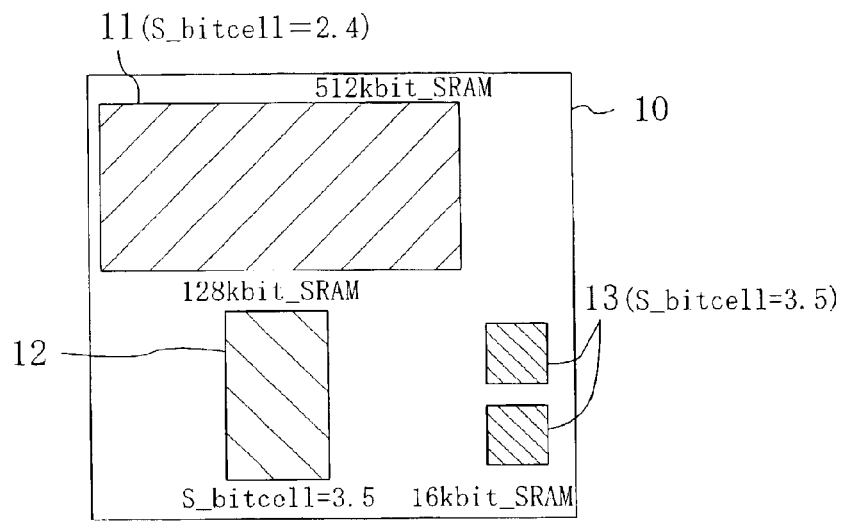
FIG. 4A is a plan view diagrammatically showing a chip-like semiconductor integrated circuit device according to EXAMPLE 1 of EMBODIMENT 1 of the present invention and an SRAM block formed on the chip.
FIG. 4B is a table of physical dimensions and conditions applied to the SRAM block of FIG. 4A.

FIG. 4A diagrammatically shows a plan structure of a chip-like semiconductor integrated circuit device according to EXAMPLE 1 of EMBODIMENT 1 of the present invention and SRAM blocks formed on the chip. FIG. 4B shows physical dimensions and conditions to be applied to the SRAM blocks.

As shown in FIG. 4A, a first SRAM block 11 having a capacity of 512 kbits, a second SRAM block 12 having a capacity of 128 kbits, and a third SRAM block 13 having a capacity of 16 kbits are formed integrally on a principal surface of a chip 10 composed of, e.g., silicon.

Here, an area (S_bitcell) occupied by a cell corresponding to one bit (bit cell) which composes the first SRAM block 11 is assumed to be 2.4 $\mu m^2$ and an area occupied by a cell corresponding to one bit (bit cell) which composes the second and third SRAM blocks 12 and 13 is assumed to be 3.5 $\mu m^2$.

As shown in FIG. 4B, the directions (gate width directions) in which the gates of the plurality of transistors composing the bit cells extend are set to specified directions in which conditions for lithography are optimized.

A detailed description will be given to the specified directions on the chip 10 with reference to the drawings.

Figure 5:
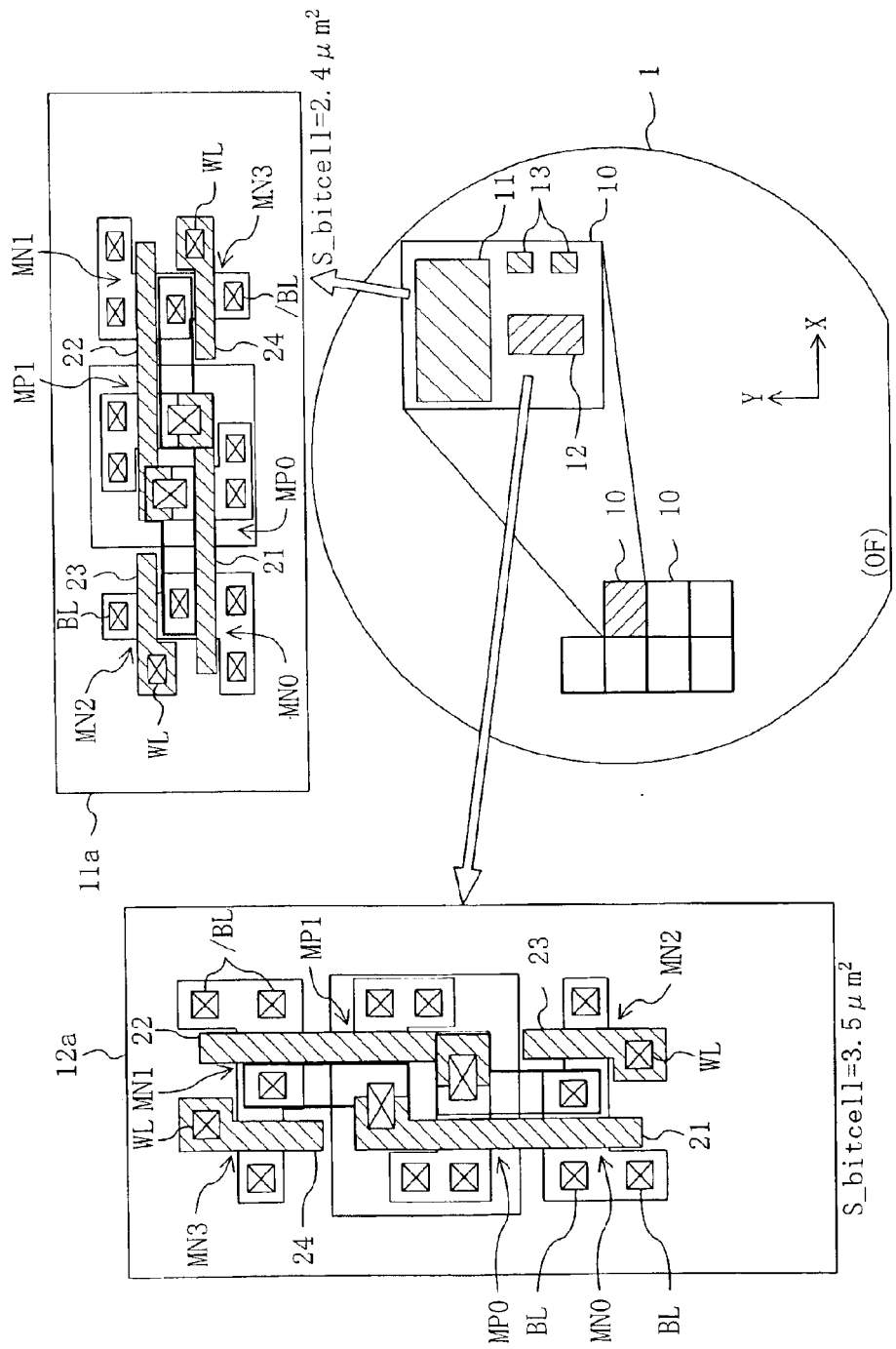
FIG. 5 is a plan view diagrammatically showing the wafer of the chip shown in FIG. 4A and bit cells contained in the SRAM block formed on the chip.

FIG. 5 diagrammatically shows each of the plurality of chips 10 which is formed on a wafer 1. As shown in FIG. 5, a bit cell 11a contained in the first SRAM block 11 has six transistors MN0, MN1, MN2, MN3, MP0, and MP1.

As has been well known, the first n-type drive transistor MN0 and the first p-type load transistor MP0 constitute a first CMOS inverter, while the second n-type drive transistor MN1 and the second p-type load transistor MP1 constitute a second CMOS inverter. Each of the first and second inverts has an input node connected in cross-coupled relation to the output node of the other.

The first access transistor MN2 is connected to the output node of the first CMOS inverter, while the second access transistor MN3 is connected to the output node of the second CMOS inverter.

The first N-type drive transistor MN0 and the first P-type load transistor MP0 share a first gate 21, while the second N-type drive transistor MN1 and the second P-type load transistor MP1 share a second gate 22.

The third gate 23 of the first access transistor MN2 having a drain shared by the first N-type drive transistor MN0 and the first P-type load transistor MP2 is provided in parallel with the first and second gates 21 and 22.

Likewise, the fourth gate 24 of the second access transistor MN3 having a drain shared by the second N-type drive transistor MN1 and the second P-type load transistor MP1 is also provided in parallel with the first and second gates 21 and 22.

Thus, the respective gates 21 to 24 of the six transistors MN0, MN1, MN2, MN3, MP0, and MP1 have their gate width directions coincident with the direction of the X axis which is parallel with, e.g., the orientation flat (OF) of the wafer 1.

On the other hand, a bit cell 12a contained in the second SRAM block 12 has the same structure as the bit cell 11a, as shown in FIG. 5. In the drawings, like parts are designated by like reference numerals. Each of the first to fourth gates 21 to 24 composing the bit cell 12a has its gate width direction oriented in the direction of the Y axis. Consequently, the gate width directions of the first to fourth gates 21 to 24 composing the bit cell 12a are orthogonal to the gate width directions of the first to fourth gates 21 to 24 composing the bit cell 11a.

It is assumed here that, e.g., the bit cell 11a has been transferred based on the first OPC mask data and the bit cell 12a has been transferred based on the second OPC mask data.

This reduces gate-related dimensions, e.g., a gate length, a gate-to-gate spacing, a gate-to-contact spacing, and the like in the first SRAM block 11, compared with the gate-related dimensions in the second SRAM block 12. As a result, the area occupied by the bit cell in the first SRAM block 11 can be reduced to 2.4 $\mu m$, which is smaller than 3.5 $\mu m$ as the area occupied by the bit cell in the second SRAM block 12.

In the second SRAM block 12, on the other hand, the longitudinal directions of the parts in the design patterns coincide with the direction of the Y axis. Accordingly, the dimensions including the gate length and the gate-to-contact spacing should be increased. As a result, the area occupied by the bit cell in the second SRAM block 12 is increased to 3.5 $\mu m$, which is larger than the area occupied by the bit cell in the first SRAM block 11.

In performing, e.g., patterning for determining the respective gate lengths of the gates 21 to 24 in the first and second SRAM blocks 11 and 12, it is generally difficult to suppress patterning variations in a lithographic step and in an etching step in all directions, i.e., without specifying the direction to the direction of the X axis or the Y axis.

Since EMBODIMENT 1 can retain required patterning accuracy by specifying the directions (gate width directions) in which the gates extend to the direction of the X axis in at least one of the plurality of functional blocks and preferentially optimizing the conditions for lithography in the specified direction, it can achieve an access time, a low leakage current, or the like required for the bit cell 11a.

In this case, the conditions for lithography in another direction deviated from the specified direction, e.g., in the direction of the Y axis have not been optimized. Therefore, patterning accuracy, i.e., the maximum size value of the design pattern should be sacrificed. For the bit cell 12a which is laid out to have the gate width directions oriented in a direction involving the sacrifice, i.e., only in the direction of the Y axis, the dimensions including the gate lengths and the gate-to-contact spacings are increased even at the expense of a reduction in the area occupied by the bit cell 12a such that the circuit elements are obtained by patterning exactly as designed.

As shown in FIG. 4A, the first SRAM block 11 has a large memory capacity and occupies a large area on the chip 10, while the second SRAM block 12 has a small memory capacity and occupies an area smaller than that occupied by the first SRAM block 11 on the chip 10. In the first SRAM block 11, therefore, the conditions for lithography and etching are optimized by giving a higher priority to gate width directions so that the maximum size value which reduces the bit cell area is applied thereto. To the second SRAM block 12 which should be sacrificed in terms of process conditions, on the other band, the minimum size value larger than the minimum size value applied to the first SRAM block 11 is applied.

Thus, according to EMBODIMENT 1, the layout of the first SRAM block 11 which has a large capacity and in which the bit cell area is to be further reduced is limited to a specified direction. To the second SRAM block 12 free from the limitation and having a smaller memory capacity, a relatively large bit cell area is applied. This reduces the area of each of the first and second SRAM blocks 11 and 12 so that the area of the chip 10 is reduced resultantly.

Although EMBODIMENT 1 has described the SRAM blocks formed in the semiconductor integrated circuit device, the functional blocks are not limited to the SRAM blocks.

EXAMPLE 2 OF EMBODIMENT 1

By way of example, a description will be given herein below to the case where "Layout Density", which is the second geometric feature, is applied to the determination of "Area of Contacts" or "Number of Contacts" which is the fourth category of the physical dimensions to be applied.

Here, a layout design rule for determining physical dimensions to be applied to "Area of Contact" or "Number of Contacts" is determined selectively based on "Layout Density" which is the second geometric feature.

Figure 6A:
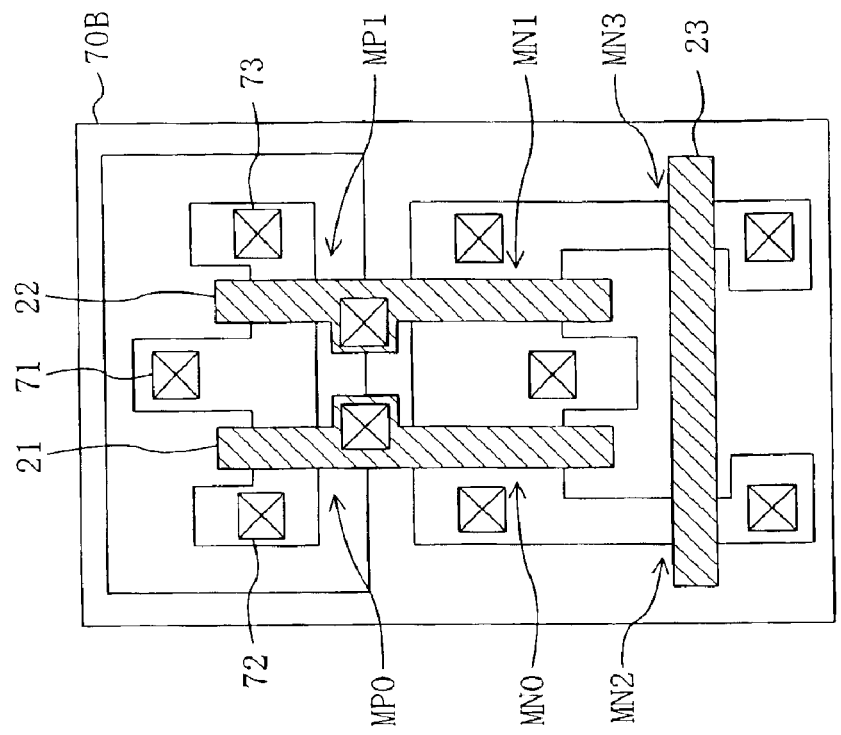
Figure 6B:
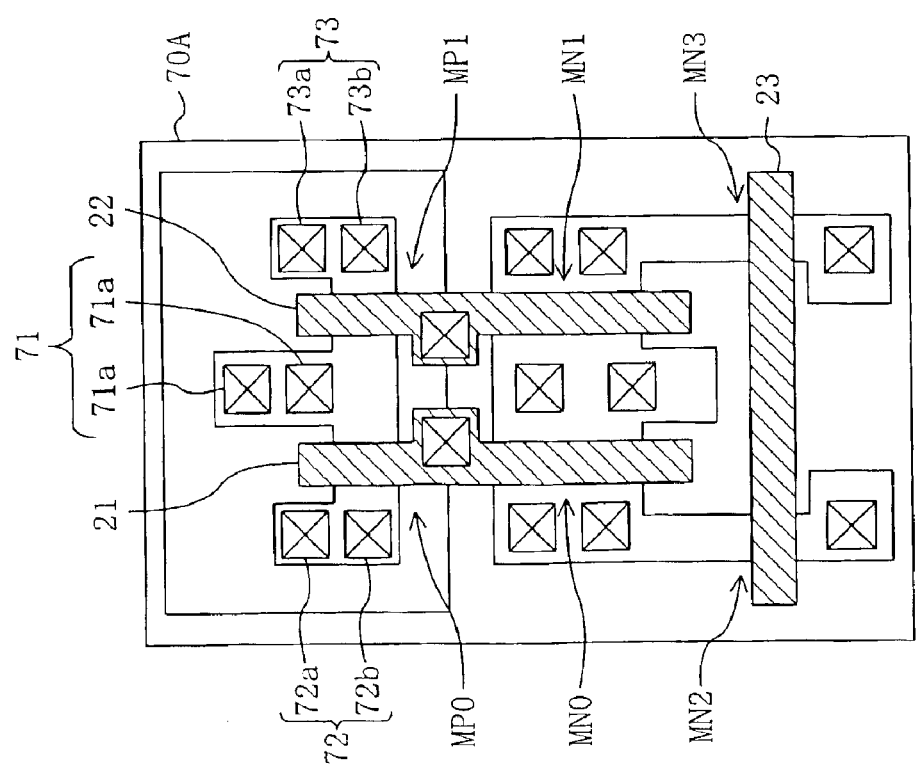

FIGS. 6A and 6B show a variation of bit cells contained in an SRAM blocks formed in a semiconductor integrated circuit device according to EXAMPLE 2 of EMBODIMENT 1 of the present invention, of which FIG. 6A shows a plan structure of a bit cell provided with two contacts formed in a specified contact formation region and FIG. 6B shows a plan structure of a bit cell provided with one contact formed in a specified contact formation region. In FIGS. 6A and 6B, the description of the same parts of the bit cells shown in FIG. 5 will be omitted by retaining the same reference numerals.

As shown in FIGS. 6A and 6B, the first and second bit cells 70A and 70B have respective first and second access transistors MN2 and MN3 sharing a third gate 23.

Next, a description will be given to the determination of primary contacts in the first and second bit cells 70A and 70B.

As shown in FIG. 6A, if attention is focused only on the P-type transistors of the first bit cell 70A, a P-type source contact 71 provided on the common source of first and second P-type load transistors MP0 and MP1 is composed of first and second contacts 71a and 71b. Likewise, a first P-type drain contact 72 provided on the first P-type load transistor MP0 is composed of first and second contacts 72a and 72b, while a second P-type drain contact 73 provided on the second P-type load transistor MP1 is composed of first and second contacts 73a and 73b.

As shown in FIG. 6B, on the other hand, a P-type source contact 71 provided on the common source of the first and second P-type load transistors MP0 and MP1 of the second bit cell 70B is composed of one contact. Likewise, each of a first P-type drain contact 72 provided on the first P-type load transistor MP0 and a second P-type drain contact 73 provided on the second P-type load transistor MP1 is composed of one contact. The relationship is also established in the same manner as in the first and second drive transistors MN0 and MN1 of the first and second bit cells 70A and 70B.

For the sake of convenience, a layout in a bit cell, such as the bit cell 11a shown in FIG. 5, in which all of the gates 21 to 24 are arranged in parallel will be termed a horizontally elongated layout and a layout in a bit cell, such as the bit cell 70a or 70b shown in FIG. 6A or 6B, in which the third gate is disposed to cross the first and second gates 21 and 22, will be termed a vertically elongated layout.

EXAMPLE 3 OF EMBODIMENT 1

By way of example, a description will be given herein below to the case where "Region", which is the first geometric feature, is applied "Relative Design-Rule Sizes" and "Bit Cell Area" which are the first and third categories of the physical dimensions to be applied.

In EXAMPLE 3, a layout design rule for determining physical dimensions to be applied to "Relative Design-Rule Sizes" and "Bit Cell Area" is determined selectively based on "Region" which is the first geometric feature.

Figure 7:
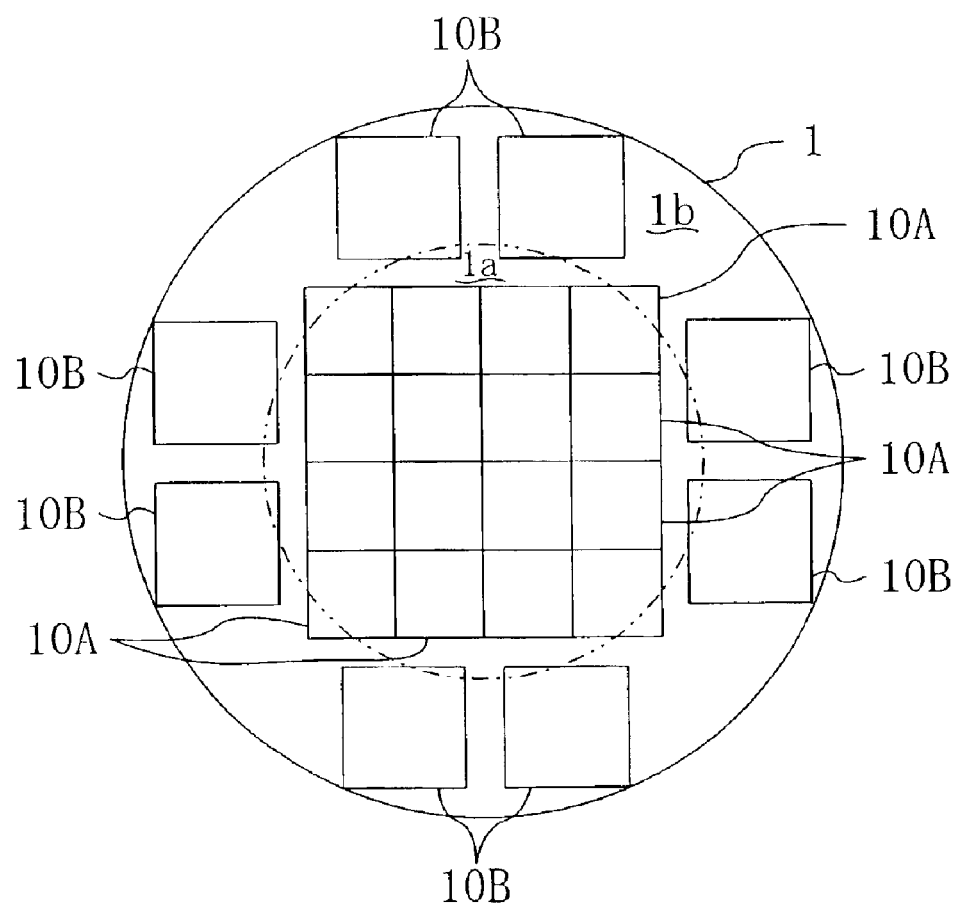
FIG. 7 is a diagrammatical plan view of a semiconductor wafer according to EXAMPLE 3 of EMBODIMENT 1 and of a chip layout on the wafer.

FIG. 7 diagrammatically shows a plan structure of a semiconductor wafer and a chip layout according to EXAMPLE 3 of EMBODIMENT 1 of the present invention.

As shown in FIG. 7, the principal surface of a wafer 1 is partitioned into first and second regions 1a and 1b at every given radial distance from the center of the chip 10.

For example, the area of a first chip 10A formed in the first region 1a positioned at the center of the wafer 1 is set to 50 mm$^2$ by assuming that the F value is 1.0 and the area of a second chip 10B formed in the second region 1b positioned on the periphery of the wafer 1 is set to 70 mm$^2$ by assuming that the F value is 1.2.

Further, the area of a bit cell in a memory circuit formed on the first chip 10A is set to, e.g., 2.4 $\mu$m$^2$ and the area of a bit cell in a memory circuit formed on the second chip 10B is set to, e.g., 3.5 $\mu$m$^2$.

Thus, EXAMPLE 3 considers the shrinkage rate of the wafer and adjusts the area of the first chip 10A and the area of the bit cell in the first region 1a at which the shrinkage rate is relatively low to be smaller than the area of the second chip 10B and the area of the bit cell in the second region 1b at which the shrinkage rate is relatively high, thereby achieving miniaturization. In EXAMPLE 3, therefore, mask data differs depending on the distance from the center of the wafer 1.

EXAMPLE 4 OF EMBODIMENT 1

By way of example, a description will be given herein below to the case where "Region", which is the first geometric feature, is applied to "Relative Design-Rule Sizes" which is the first category of the physical dimensions to be applied. In EXAMPLE 4 also, a layout design rule for determining physical dimensions to be applied to "Relative Design-Rule Sizes" is determined selectively based on "Region" which is the first geometric feature.

Figure 8:
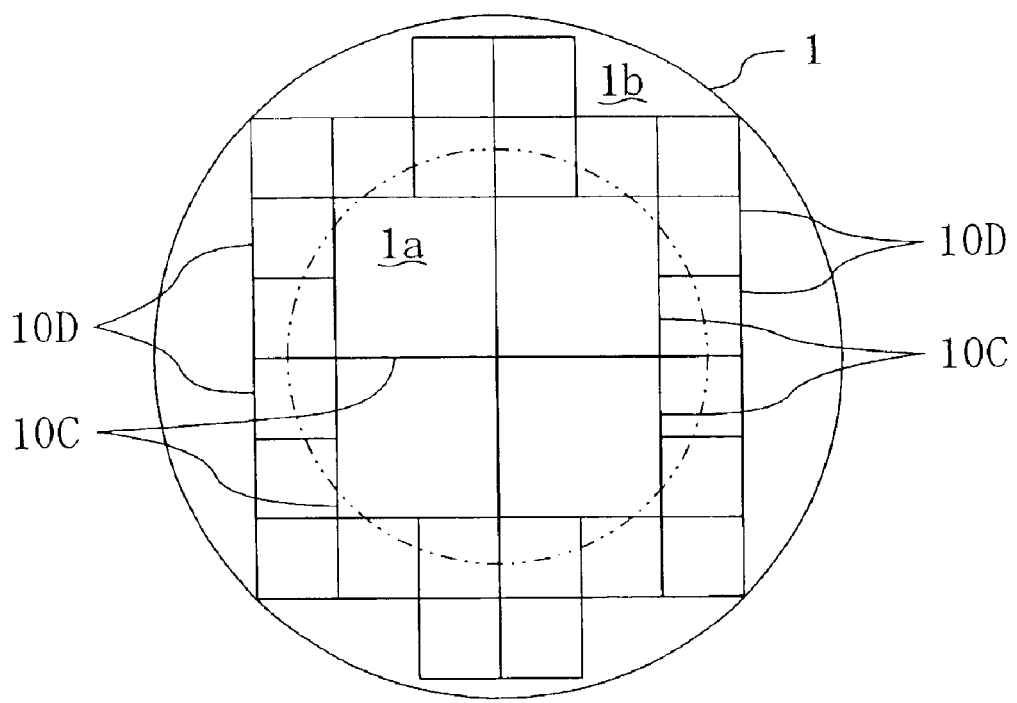
FIG. 8 is a diagrammatical plan view of a semiconductor wafer according to EXAMPLE 4 of EMBODIMENT 1 and of a chip layout on the wafer.

FIG. 8 diagrammatically shows a plan structure of a semiconductor wafer and a chip layout according to EXAMPLE 4 of EMBODIMENT 1 of the present invention.

As shown in FIG. 8, the principal surface of a wafer 1 is partitioned into first and second regions 1a and 1b at every given radial distance from the center of the chip 10.

In one example, the area of a first chip 10C formed in the first region 1a positioned at the center of the wafer 1 is set to 150 mm$^2$ by assuming that the F value is 1.0 and the area of a second chip 10D formed in the second region 1b positioned on the periphery of the wafer 1 is set to 30 mm$^2$ without changing the F value.

In another example, the gate length Lg of a transistor formed on the first chip 10C contained in the first region 1a of the wafer 1 is set to 0.15 $\mu$m and the gate length Lg of a transistor formed on the second chip 10D contained in the second region 1b of the wafer 1 is set to 0.18 $\mu$m.

Thus, EXAMPLE 4 places the first chip 10C in which a wiring length is increased by a relatively large chip area to reduce a timing margin at the center portion of the wafer 1.

In EXAMPLE 4, therefore, mask data differs depending on the distance from the center of the wafer 1 even if one layout design rule is used.

EXAMPLE 5 OF EMBODIMENT 1

By way of example, a description will be given herein below to "Configuration", which is the fifth geometric feature, i.e., to the configuration of a base composed of a semiconductor onto which a design pattern is to be transferred.

In EXAMPLE 5, a layout design rule for determining physical dimensions to be applied to "Relative Design-Rule Sizes" is determined selectively based on the configuration of the base composed of a semiconductor as the fifth geometric feature.

Figure 9A:
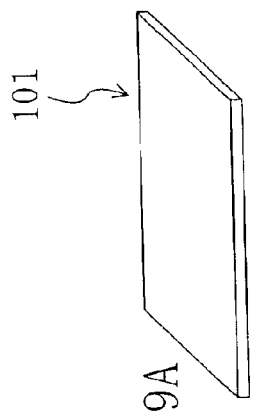
FIGS. 9A to 9C are perspective views of a base made of a semiconductor and composing a semiconductor integrated circuit device according to EXAMPLE 5 of EMBODIMENT 1.
Figure 9B:
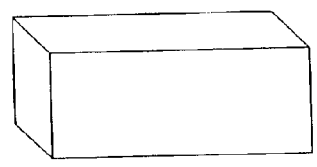
Figure 9C:
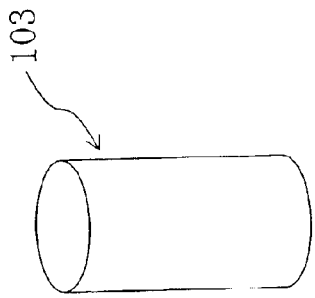

FIG. 9A to 9C show the base composed of a semiconductor which forms a semiconductor integrated circuit device according to EXAMPLE 5 of EMBODIMENT 1 of the present invention. FIG. 9D shows the dependence of a focal depth on the surface configuration of the base in a lithographic step and FIG. 9E shows the dependence of an etch rate on the surface configuration of the base in an etching step.

FIG. 9A shows a plate-like (chip-like) first base 101 used normally, which is a so-called semiconductor substrate. FIG. 9B shows a rectangular parallelepiped second base 102. FIG. 9C shows a cylindrical third base 103.

Figure 9E:
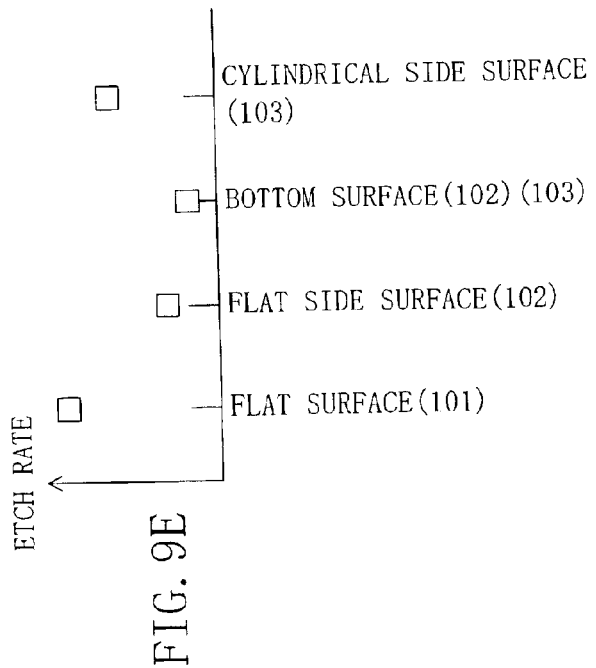
FIG. 9E is a graph showing the dependence of an etch rate on the configuration of the base surface in an etching step.
Figure 9D:
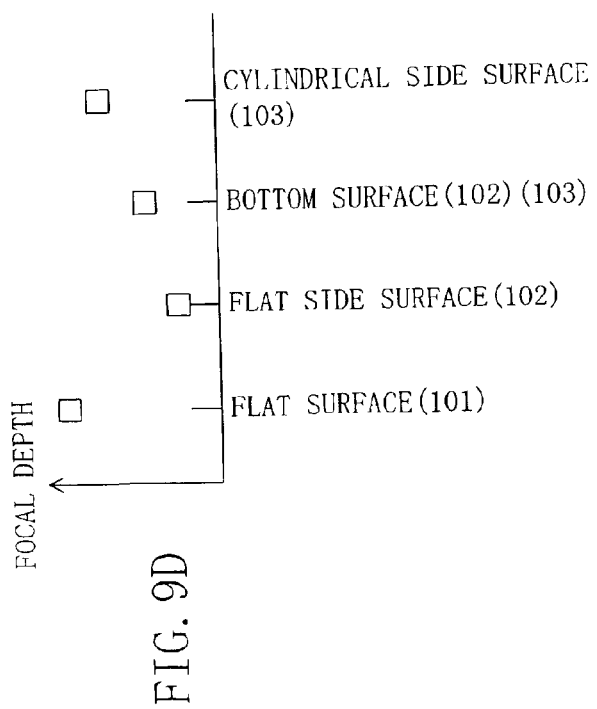
FIG. 9D is a graph showing the dependence of a focal depth on the configuration of a base surface in a lithographic step.

As shown in FIGS. 9D and 9E, if the focal depth in the lithographic step or the etch rate has the dependence, not only the layout design rule but also the bit cell area in the memory circuit should be changed so that mask data is different at the flat surface of the first base 101, at the flat side surface of the second base 102, at the bottom surface of each of the second and third bases 102 and 103, and at the cylindrical side surface of the third base 103.

EMBODIMENT 2

Referring to the drawings, EMBODIMENT 2 of the present invention will be described.

In EMBODIMENT 2, layout design rules in each of the placement regions are categorized depending on different finished sizes resulting from an electric specification required of an integrated circuit device and a designing method for implementing the electric specification.

Figure 10:
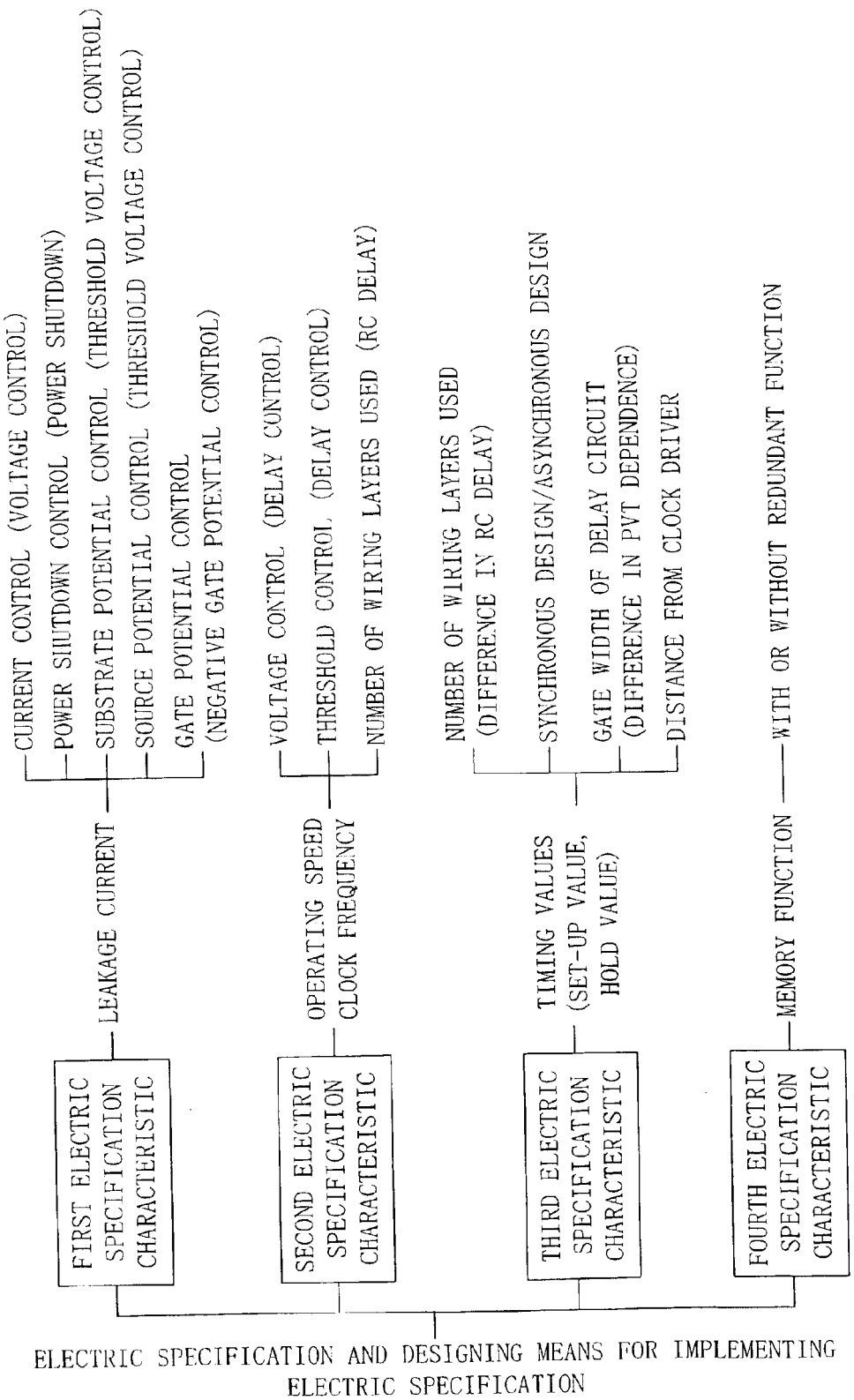
FIG. 10 is a view showing a category system of electric specification characteristics in design patterns composing the semiconductor integrated circuit device according to the present invention and a designing method for implementing the electric specification characteristics.

FIG. 10 shows the characteristics of electric specification characteristics in a design pattern and designing methods for implementing the electric specification characteristics, which are grouped into four categories.

A first electric specification characteristic is "Leakage Current" in a design pattern. Examples of the designing method capable of suppressing "Leakage Current" are power voltage control, power shutdown control, threshold voltage control (substrate potential control or source potential control), and gate-to-source potential difference control.

A second electric specification characteristic is "Operating Speed and Clock Frequency". Designing methods which allow the determination of "Operating Speed (Clock Frequency)" are delay control effected by power supply voltage control, delay control effected by threshold voltage control, and RC delay control effected by using variations in the number of wiring layers used in a layout.

A third electric specification characteristic is "Timing Values (a set-up value and a hold value for a clock signal)". Designing methods which allow the determination of "Timing Values" are RC delay control effected by using variations in the number of wiring layers used in a layout, selection of synchronous design/asynchronous design, the gate length of a delay circuit transistor for timing adjustment, and a layout which adjusts a distance from a clock driver. The set-up value is defined herein as a time interval between a reference time determined by the clock signal and a time at which a data value should be determined prior to the reference time and the hold value is defined herein as a time during which the determined data value is held.

A fourth electric specification characteristic is "Memory Function". A designing method for determining "Memory Function" is the determination of whether or not a redundancy function is provided.

EXAMPLE 1 OF EMBODIMENT 2

In EXAMPLE 1, a description will be given to different finished sizes resulting from "Leakage Current" which is the first electric specification.

Figure 11A:
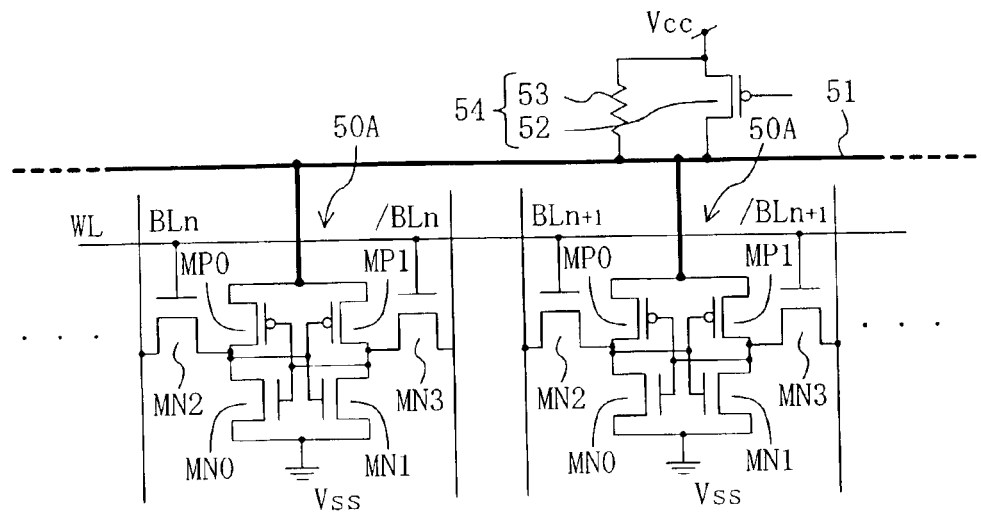
Figure 11B:
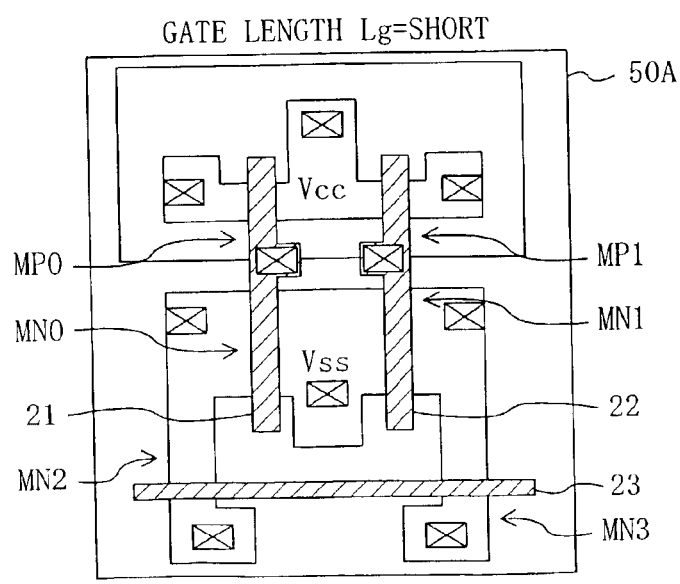

FIGS. 11A and 11B show an SRAM block formed in a semiconductor integrated circuit device according to EXAMPLE 1 of EMBODIMENT 2 of the present invention, of which FIG. 11A shows a circuit structure of the SRAM block in which current voltage control is performed and FIG. 11B shows a plan structure of bit cells contained in the SRAM block.

Figure 12A:
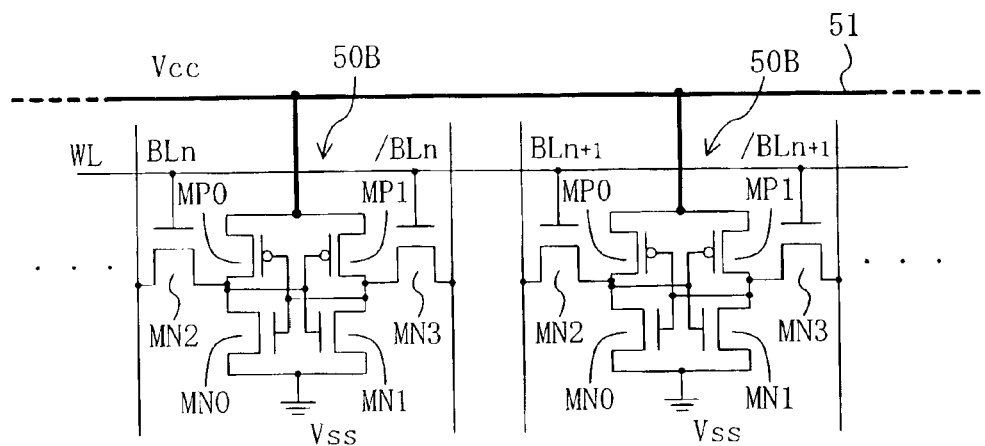
Figure 12B:
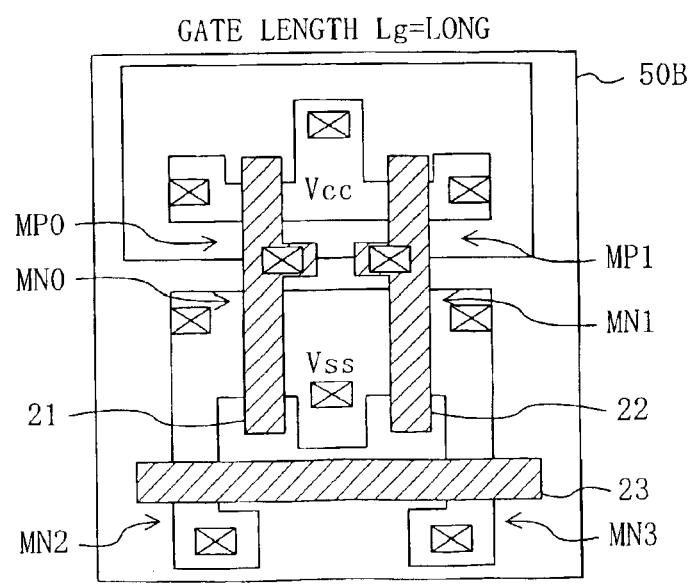

FIGS. 12A and 12B show another SRAM block formed in the semiconductor integrated circuit device shown in FIG. 11A, of which FIG. 12A shows a circuit structure of the SRAM block in which current voltage control is not performed and FIG. 12B shows a plan configuration of bit cells contained in the SRAM block. As shown in FIGS. 11B and 12B, the structures of the bit cells 50A and 50B are the same as the structure of, e.g., the second bit cell 70B shown in FIG. 6B. In the drawings, like parts are designated by like reference numerals.

In EXAMPLE 1, the physical dimension to be applied shown in FIG. 3 is assumed to be "Length/Width" of "Relative Design-Rule Sizes".

As shown in FIG. 11A, a bit cell 50A is provided with a leakage suppressing circuit 54 composed of a current control switch 52 and a resistor 53 connected in parallel between a power supply for supplying a power supply voltage Vcc to the common source of first and second P-type transistors MP0 and MP1 and a power supply line 51.

During standby, the power supply line 51 is disconnected from the power supply by turning OFF the current control switch 52 so that a leakage current is allowed to flow in the resistor 53. Accordingly, a voltage drop changes an amount of voltage drop depending on the leakage current and the voltage applied to the bit cell 50A lowers automatically so that the leakage current in the bit cell 50A is suppressed.

In accordance with such an electric specification characteristic, the bit cell 50A capable of suppressing a leakage current with the leakage suppressing circuit 54 provided therein can suppress an increase in leakage current during standby even if a leakage current is made more likely to flow in the bit cell 50A by applying a design rule which reduces the respective gate lengths Lg of gates 21, 22, and 23 composing the bit cell 50A in order to achieve higher-speed operation of the transistors, as shown in FIG. 11A.

To an SRAM block not provided with the leakage suppressing circuit 54, on the other hand, a design rule which makes the area occupied by the bit cell 50B larger than the area occupied by the bit cell 50A by increasing the respective gate lengths Lg of gates 21, 22, and 23 is applied, as shown in FIG. 12A.

Thus, EXAMPLE 1 achieves a reduction in the gate length Lg of each of the gates 21, 22, and 23 in the SRAM block provided with the leakage suppressing circuit 54. If the error between the expected value based on first OPC mask data and the expected finished size exceeds a tolerable value, the expected value of the OPC mask data can be changed easily by generating second OPC mask data by using a second layout design rule.

Although the description has been given to the SRAM block formed in the semiconductor integrated circuit device, the present invention is not limited to an SRAM block.

EXAMPLE 2 OF EMBODIMENT 2

In EXAMPLE 2, a description will be given to different finished sizes resulting from "Operating Speed (Clock Frequency)" which is the second electric specification characteristic.

By way of example, a description will be given to a structure in which a monitor circuit performs feedback control over a power supply voltage, a substrate voltage, or the like such that a clock frequency serving as a basis for circuit operation and the frequency of the monitor circuit have a specified relationship therebetween, such as a phase locked loop (PLL).

The monitor circuit is a delay control circuit capable of controlling a power supply voltage or a substrate voltage. Even if the gate lengths of transistors contained in an SRAM block become excessively short or long due to micro-patterning variations and a signal delay time varies, an amount of delay in signal propagation time can be corrected by the monitor circuit.

In an SRAM block having such a monitor circuit, even if a leakage current becomes more likely to flow as a result of reduced gate lengths when operational speed is to be increased by reducing the gate length Lg of each of the gates 21 to 23, as in the bit cell 50A contained in the SRAM block shown in FIG. 11B, the provision of a leakage suppressing circuit 54 can suppress an increase in leakage current during standby.

Thus, EXAMPLE 2 reduces the gate lengths of the individual transistors in the SRAM block provided with the monitor circuit and thereby provides a logic cell having a small bit cell area and capable of performing high-speed operation, while suppressing variations in operating speed.

On the other hand, EXAMPLE 2 increases the gate lengths of individual transistors in an SRAM block unprovided with a monitor circuit, as in the bit cell 50B contained in the SRAM block shown in FIG. 12B, and thereby provides a logic cell having a large bit cell area and small variations in operating speed.

If the error between the expected value based on the first OPC mask data and the expected finished size exceeds a tolerable value, the expected value can be changed easily based on the second layout design rule different from the first layout design rule, as has been performed with respect to the bit cell 50A.

EXAMPLE 3 OF EMBODIMENT 2

In EXAMPLE 3, a description will be given to different finished sizes resulting from "Variations in Number of Wiring Layers Used in Layout" of "Timing Values" which is the third electric specification characteristic.

Of the designing methods which allow the determination of the timing values of the electric specification characteristics, RC delay control effected by using variations in the number of wiring layers used in a layout will be described first.

Each of SRAM blocks formed on one chip has a four-layer structure irrespective of the number of wiring layers of the entire chip (normally four to seven layers) such that the chip provides for any number of layers. If an SRAM block as shown in FIG. 11A is formed on a chip of which a specification for the number of wiring layers is five to seventh layers, three wiring layers at the maximum are added to the original four layers to provide for a higher speed operation or a smaller area required of the SRAM block so that the SRAM block is designed as four to seven wiring layers.

In an SRAM block of which a higher speed and a smaller area on the chip are required, therefore, multilayer wiring is used in a technically affordable range so that a wire between other functional blocks in a wiring layer overlying another wiring layer is not contained in the underlying layer.

The following is an answer to the question of whether the influence of micro-patterning variations on the timing values is increased or decreased by variations in the number of wiring layers used in a layout. Since multilayer wiring containing a larger number of layers reduces a total length of wiring and a wiring density, the absolute values of resistance and capacitance can be reduced. Even if micro-patterning variations occur at a given rate in a portion of each of the wiring layers, therefore, the influence of the variations is negligible since the absolute value of the variation occurred is small.

If the flexibility of the multilayer wiring is high depending on the relationship between adjacent functional blocks, therefore, the absolute values of resistance and capacitance are reduced by using multilayer wiring containing a maximum permissible number of layers in designing a chip. This reduces an absolute value of timing even if the functional block is disposed in a region of the chip where micro-patterning variations are relatively large.

If the flexibility of the multilayer wiring is low depending on the relationship between a functional block of concern and an adjacent functional block, on the other hand, the functional block is disposed in a region of the chip where micro-patterning variations are relatively small.

This suppresses variations in timing allowance value when the variations are considered in view of the flexibility of multilayer wiring on the chip and the magnitude of the micro-patterning variation.

If the error between the expected value based on the first OPC mask data and the expected finished size exceeds a tolerable value, the expected value can be changed easily based on the second layout design rule different from the first layout design rule.

EXAMPLE 4 OF EMBODIMENT 2

In EXAMPLE 4, a description will be given to different finished sizes resulting from "Selection of Synchronous/Asynchronous Design" of "Timing Values (a set-up value and a hold value)" which is the third electric specification characteristic.

In synchronous design, it presents a problem whether or not micro-patterning variations impair the relationship between the set-up time, which is a relative timing difference between the clock signal and a data signal, an address signal, or the like, or the hold time and an allowance value for the set-up time or the hold time.

By contrast, asynchronous design basically receives no influence from micro-patterning variations since a relative timing value, such as the set-up time or the hold time, does not exist.

In terms of limited design time and limited design resources, however, it is nearly impossible to design all functional blocks formed on the chip asynchronously. As a result, functional blocks designed synchronously and functional blocks designed asynchronously exist in mixed relation on the chip.

If the functional blocks designed asynchronously are disposed in the region of the chip where micro-patterning variations are small and the functional blocks designed synchronously are disposed in the region of the chip where micro-patterning variations are large, therefore, variations in timing allowance value when the variations are considered can be suppressed. This implements a semiconductor integrated circuit device with a high yield rate.

EXAMPLE 5 OF EMBODIMENT 2

In EXAMPLE 5, a description will be given to different finished sizes resulting from "Gate Width of Delay Circuit Transistor for Timing Adjustment" of "Timing Values" which is the third electric specification characteristic.

Because of large micro-patterning variations in the chip, in a delay circuit which should inevitably be disposed in a region where variations in gate width are large, the influence of the variations is reduced by increasing the gate width even at the expense of a circuit area.

In the case where the delay circuit can be disposed in a region where variations in gate width are small, however, the gate width can be reduced by giving a higher priority to a reduction in circuit area.

If the error between the expected value based on the first OPC mask data and the expected finished size exceeds a tolerable value, therefore, the expected value can be changed easily based on the second layout design rule different from the first layout design rule.

EXAMPLE 6 OF EMBODIMENT 2

In EXAMPLE 6, a description will be given to different finished sizes resulting from "Layout for Adjusting Distance from Clock Driver" of "Timing Values" which is the third electric specification characteristic.

In general, a plurality of clock drivers are placed at positions on a chip as close as possible to the regions to which a clock signal is supplied. Although the placement of a larger number of clock drivers is advantageous to a design margin in timing design, the area is increased thereby disadvantageously through the tradeoff between the number of clock drivers placed and a circuit area.

If the magnitude of micro-patterning variation has dependence on the distance from the center of the chip, EXAMPLE 6 allows the distance from each of the clock drivers to the corresponding one of the regions to which a clock is supplied to have a distribution dependent on the distance from the center of the chip, thereby reducing variations in timing allowance value. This increases the yield rate of the chip.

If the error between the expected value based on the first OPC mask data and the expected finished size exceeds a tolerable value, therefore, the expected value can be changed easily based on the second layout design rule different from the first layout design rule.

EXAMPLE 7 OF EMBODIMENT 2

In EXAMPLE 7, a description will be given to different finished sizes resulting from "Presence or Absence of Redundancy Function" of "Memory Function" which is the fourth electric specification characteristic.

Figures 13A, 13B:
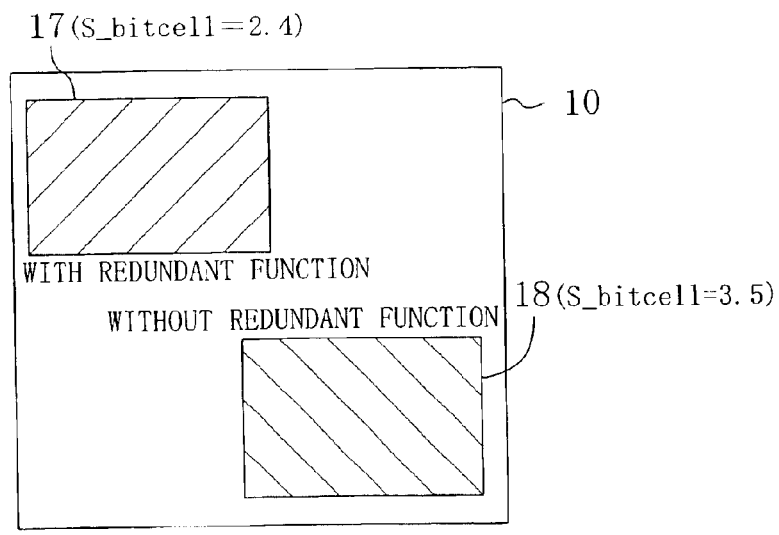
FIG. 13A is a table of physical dimensions and conditions to be applied to design patterns in SRAM blocks formed on a chip-like semiconductor integrated circuit device according to EXAMPLE 7 of EMBODIMENT 2.
FIG. 13B is a plan view diagrammatically showing SRAM blocks satisfying the conditions shown in FIG. 13A.

As shown in FIG. 13A, EXAMPLE 7 assumes the physical dimension to be applied to be "Bit Cell Area" and will refer to "Memory Function", which is a fourth electric specification characteristic. A designing method for determining "Memory Function" is the determination of whether or not a redundancy function is provided.

FIG. 13B diagrammatically shows a plan structure of a chip-like semiconductor integrated circuit device according to EXAMPLE 7 of EMBODIMENT 2 and SRAM blocks formed on the chip. As shown in FIG. 13B, a first SRAM block 17 having a capacity of 512 kbits and a second SRAM block 18 having a capacity of 512 kbits are formed integrally on a principal surface of the chip 10 composed of, e.g., silicon.

The first SRAM block 17 has a redundancy function and contains bit cells each occupying an area (S_bitcell) of 2.4 $\mu m^2$. On the other hand, the second SRAM block 18 does not have a redundancy function and contains bit cells each occupying an area of 3.5 $\mu m^2$.

Thus, the bit cells contained in the SRAM blocks have different areas depending on the presence or absence of the redundancy function in the memory.

Figure 14A:
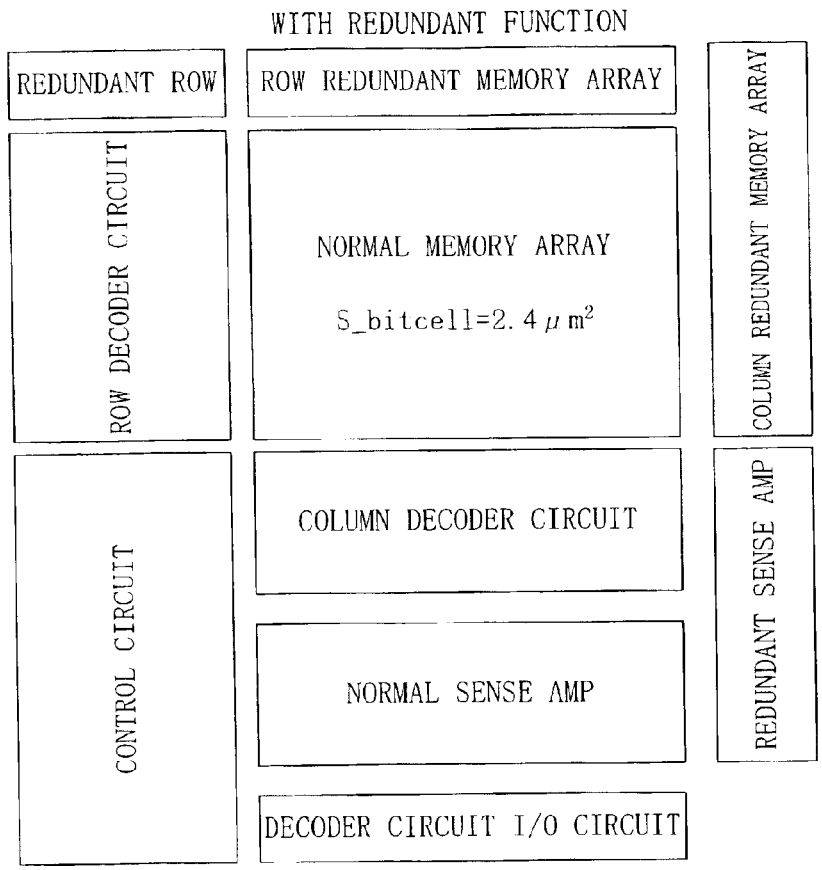
Figure 14B:
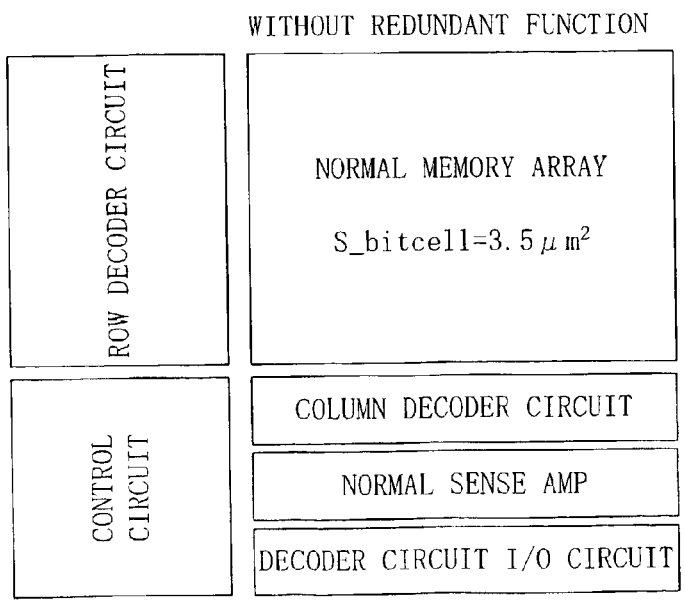

FIG. 14A shows a structure of the SRAM block having the redundancy function. FIG. 14B shows a structure of the SRAM not having the redundancy function. To impart the redundancy function to the SRAM block, redundancy circuits including a redundancy row, a redundancy memory array, and a redundancy sense amp are added as shown in FIG. 14A. As for the area, it is simply increased with the addition of the redundancy circuits.

Even if micro-patterning variations in the fabrication process causes faults in several bits, however, the redundancy function substantially saves the faulty bits by replacing the faulty bits with redundancy bits. Even if a defect density (DD value) is increased by reducing the sizes of the bit cells at a design stage and reducing a margin when micro-patterning variations are considered, the yield rate of an SRAM portion can be improved if consideration is given to the redundancy function. This achieves a reduction in effective DD value, while achieving a reduction in the area occupied by each of the bit cells, as illustrated in the graph FIG. 15.

As shown in FIG. 15, the yield rate is improved greatly in the case where the redundancy function is provided, which is indicated by the solid curve A, and the effective DD value is reduced, compared with the case where the redundancy function is not provided, which is indicated by the broken curve B. By thus selectively using the SRAM blocks depending on the presence or absence of the redundancy function and the magnitude of the bit cell area, the area occupied by the entire chip can be reduced and the yield rate can be improved.

If the effective DD value depends on the distance from the center of the chip, it is also possible to determine whether or not the redundancy circuits are provided depending on the distance from the center of the chip.

A description will be given herein below to relationships observed between the area occupied by each of the bit cells and the DD value.

In a first relationship, the DD value is increased if the area occupied by the bit cell is reduced. This is because, for a reduced area occupied by the bit cell, the dimensions of the individual parts of a design pattern, i.e., the gate, the source, the drain, and the like should inevitably be reduced so that the spacing between the wires or the elements is also reduced and the probability of a fault occurring under the influence of a minor defect or pattern shift becomes high.

In a second relationship, the area occupied by the bit cell varies with the number of contacts provided in the bit cell (determination of the number of contacts) and the DD value also varies with the number of contacts provided in the bit cell.

In the case where two contacts are provided on each of the source and drain as in the first bit cell 70A shown in FIG. 6A, even if one of the two contacts becomes faulty, the entire bit cell does not become faulty.

The comparison and consideration of the first and second relationships described above allows selective use of the structures of the contacts depending on the presence or absence of the redundancy function.

In this case, if the error between the expected value based on the first OPC mask data and the expected finished size exceeds a tolerable value due to the presence or absence of the redundancy function in the memory device, the expected value of the bit cell pattern contained in, e.g., the first SRAM block 17 can be changed easily based on the second layout design rule different from the first layout design rule.

EMBODIMENT 3

Referring to the drawings, EMBODIMENT 3 of the present invention will be described.

In EMBODIMENT 3, layout design rules are categorized in each of the placement regions depending on a required specification which differs depending on the usage mode of an integrated circuit device.

Figure 16:
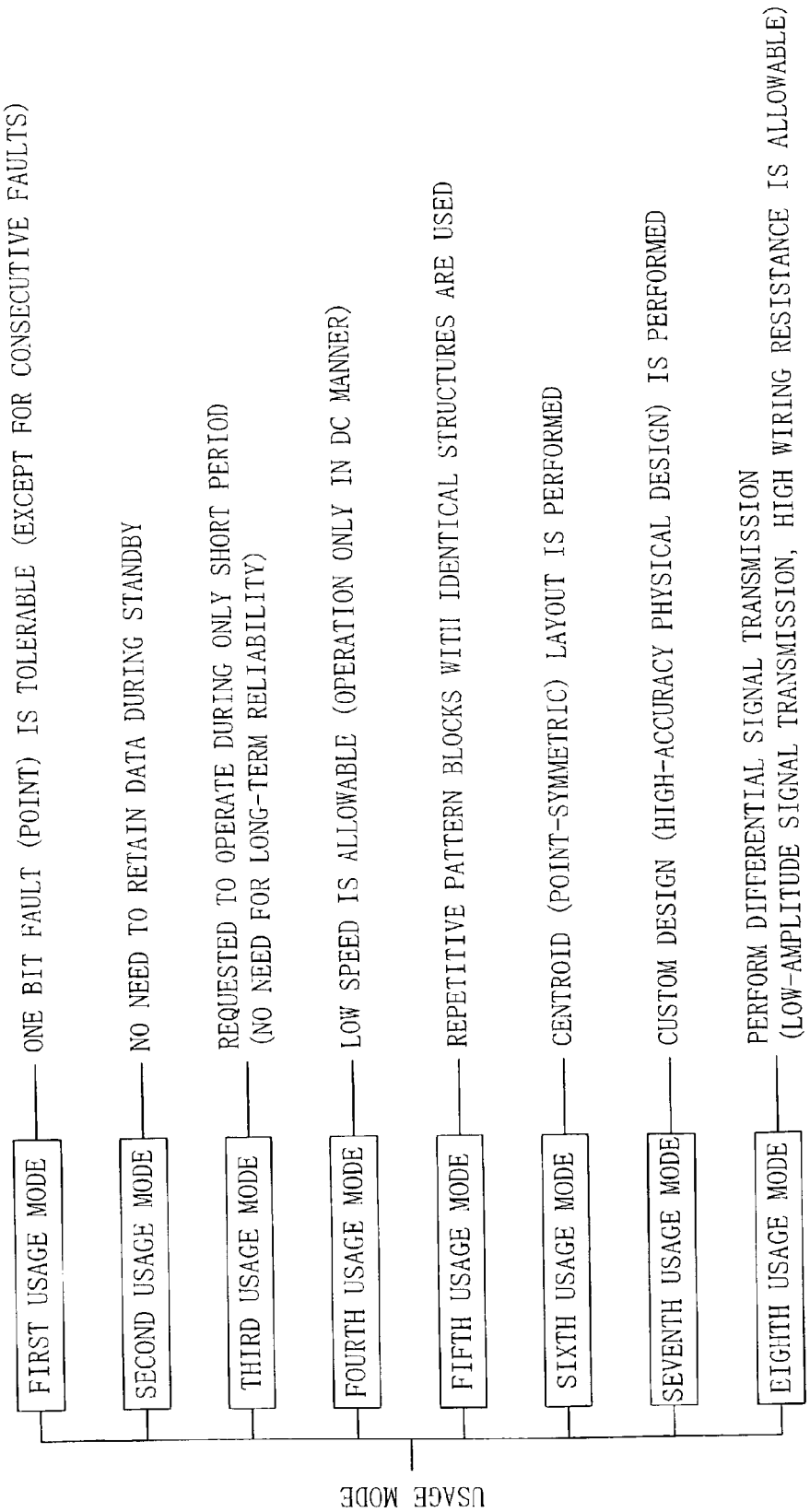
FIG. 16 shows a category system of usage modes in design patterns composing the semiconductor integrated circuit device according to the present invention.

FIG. 16 shows the eight categories of usage modes in a design pattern and required specifications which differ depending on the usage modes.

In the first usage mode, a one bit fault is tolerated if a circuit element is a memory element (except for consecutive bit faults). In the second usage mode, data need not be retained during standby. In the third usage mode, it is sufficient to operate for a relatively short period. In the fourth usage mode, an operating speed may be relatively low (operation in a DC manner). In the fifth usage mode, repetitive pattern blocks having identical structures are used. In the sixth usage mode, centroid (point-symmetric) layout is performed. In the seventh usage mode, custom design (high-precision physical design) is performed. In the eighth usage mode, signal transmission is performed by a differential operation (small signal transmission, i.e., a wiring resistance may be high).

First, the usage modes of a semiconductor integrated circuit device will be described.

While the future trend is toward the formation of a plurality of functional blocks on one chip, it will be a rare case that all functional blocks are used only for one application. If a frame buffer is used as an example, it will be used for various purposes as a frame buffer for display, a frame memory for storing the result of an arithmetic operation for compression or decompression, and the like, so that requirements placed on the frame memory differ.

If other functional blocks are to be designed or fabricated to satisfy the most stringent requirement which is placed with regard to conditions for design or fabrication, high costs should be paid. If a sufficient margin is allowed for micro-patterning variations, as has been allowed conventionally, it becomes possible to uniformly fabricate all the functional blocks and design and test all the functional blocks in accordance with the same specifications.

A description will be given next to a method for changing the design rules for a chip in accordance with its various usage modes shown below under situations forming the background of the present invention.

EXAMPLE 1 OF EMBODIMENT 3

In EXAMPLE 1, a description will be given to "Tolerance of Smaller Number of Bit Defects (except for consecutive bit defects) in Memory Device" which is the first usage mode.

For example, in a frame buffer memory used merely for display, not as a frame buffer used for a digital arithmetic operation, 24 bits of color data is required to display each pixel. To represent luminance data, 6 bits are required. Even if a fault has occurred in one of the bits, however, it cannot be discriminated by human eyes.

Even if all the bits representing one pixel are faulty, one pixel in a display device having ten thousands of pixels arranged in 100 rows and 100 columns accounts for only 0.01% of all the pixels, which is at a level unrecognizable by human eyes and therefore tolerated. There is little necessity to incorporate a redundancy function as described in EXAMPLE 7 of EMBODIMENT 2 into such a frame buffer memory. Even if it is incorporated, the redundancy function may be disposed appropriately in a region where micro-patterning variations are large.

Figures 17A, 17B:
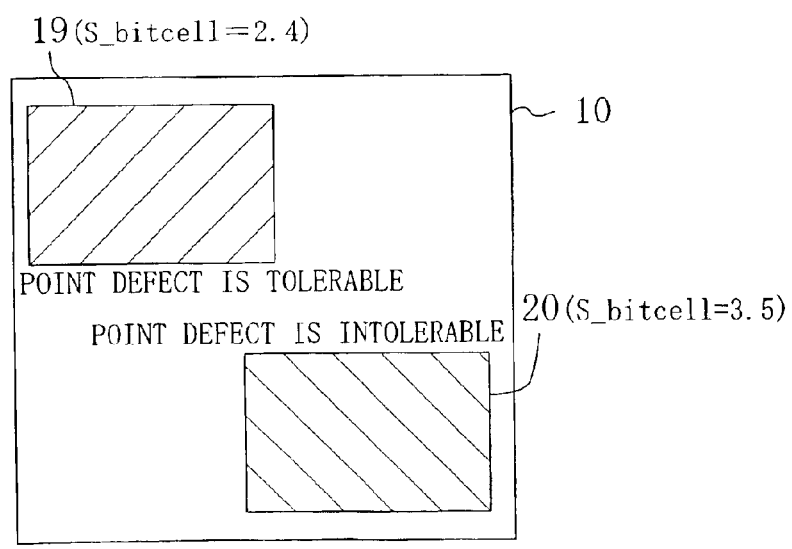
FIG. 17A is a table of physical dimensions and conditions to be applied to design patterns in SRAM blocks formed on a chip-like semiconductor integrated circuit device according to EXAMPLE 1 of EMBODIMENT 3 of the present invention.
FIG. 17B is a plan view diagrammatically showing SRAM blocks satisfying the conditions shown in FIG. 17A.

Specifically, a frame buffer for an application which requires a larger number of pixels rather than a smaller number of point defects, such as the first SRAM block 19 shown in FIG. 17B, needs a relatively large memory capacity so that a reduction in bit cell area is required. In addition, a redundancy function need not be incorporated therein since a point defect is tolerated.

In an SRAM block in which a memory capacity need not be increased but a defect (error) is not tolerated because of its use for a digital arithmetic operation, such as the second SRAM block 20, on the other hand, the probability of a defect is reduced appropriately by relatively increasing the bit cell area.

Thus, the first SRAM block 19 which has a large capacity, exhibits a high degree of integration, and tolerates a point defect is disposed in a region of the chip 10 where micro-patterning variations are relatively large. By contrast, the second SRAM block 20 which has a smaller capacity than the first SRAM block 19, exhibits a lower degree of integration than the first SRAM block 19, and does not tolerate a point defect is disposed in a region of the chip 10 where the variations are relatively small. This reduces each of areas occupied by the first and second SRAM blocks 19 and 20 and resultantly reduces the area of the chip 10.

In EXAMPLE 1, if the error between the expected value based on the first OPC mask data and the expected finished size exceeds an allowable value, the expected value of the bit cell pattern contained in the first SRAM block 19 can be changed easily based on a second layout design rule different from the first layout design rule.

EXAMPLE 2 OF EMBODIMENT 3

In EXAMPLE 2, a description will be given to "Retention/Non-Retention of Data during Standby of Memory Device" which is the second usage mode.

Figure 18A:
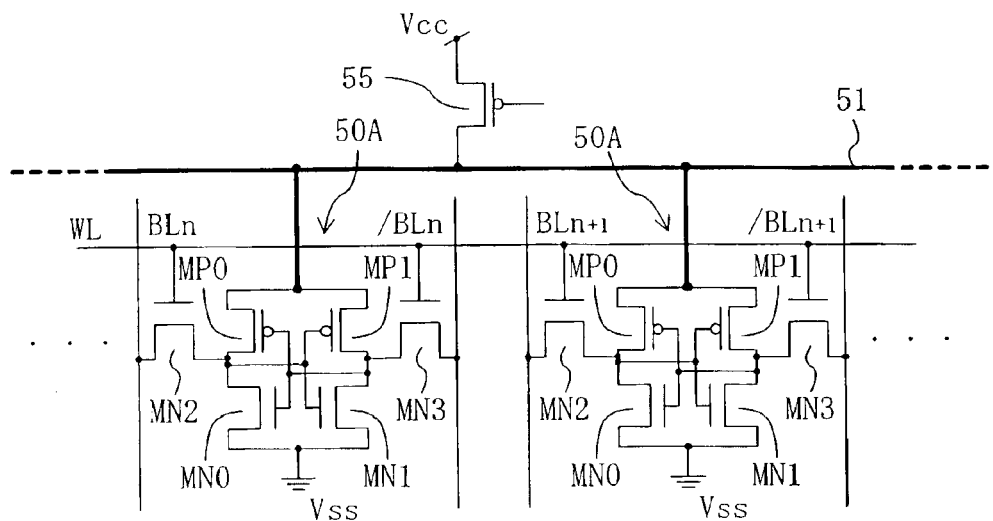
Figure 18B:
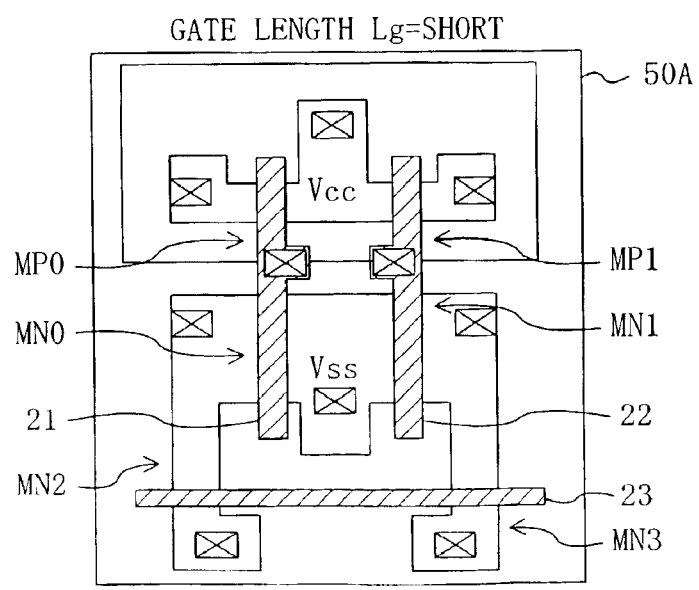

FIGS. 18A and 18B show an SRAM block formed in a semiconductor integrated circuit device according to EMBODIMENT 3 of the present invention, of which FIG. 18A shows a circuit structure of the SRAM block in which power shutdown control is performed and FIG. 18B shows a plan structure of bit cells contained in the SRAM block.

Figure 19A:
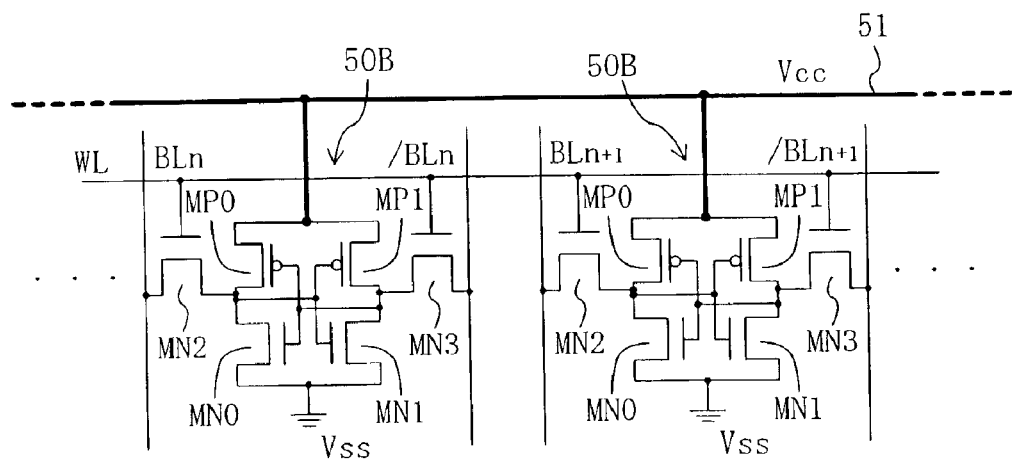
Figure 19B:
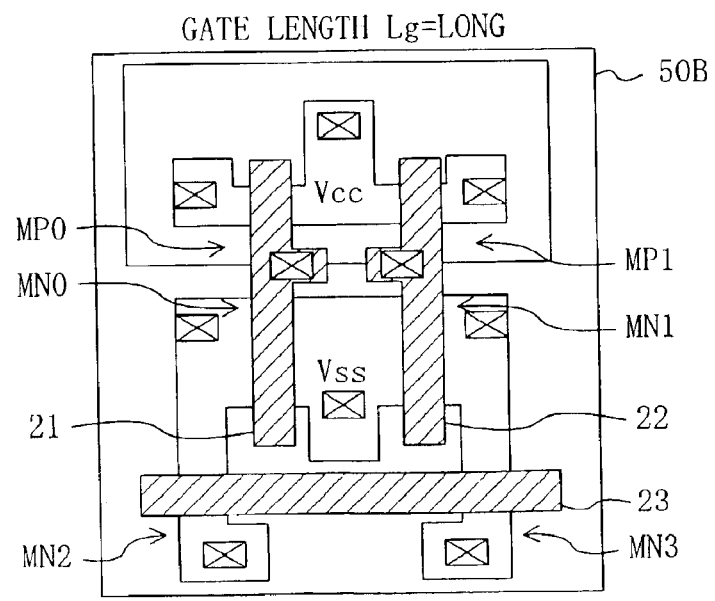

FIGS. 19A and 19B show an SRAM block formed in the semiconductor integrated circuit device, of which FIG. 19A shows a circuit structure of the SRAM block in which power shutdown control is not performed and FIG. 19B shows a plan structure of bit cells contained in the SRAM block.

The specification for the bit cell 50 shown in FIG. 18A is such that data need not be retained during standby. Accordingly, a power shutdown switch 55 is provided between a power supply for supplying a power supply voltage Vcc to the common source of first and second P-type load transistors MP0 and MP1 and a power supply line 51. The power shutdown switch 55 is turned OFF during standby so as not to supply the power supply voltage Vcc to the power supply line 51. On the other hand, the power shutdown switch 55 is turned ON during operation so as to supply the power supply voltage Vcc to the power supply line 51.

To use a semiconductor integrated circuit device having a memory circuit for mobile applications, a leakage current in the memory circuit should be suppressed during standby. Therefore, a method which most positively suppresses the leakage current is to turn OFF the power supply during standby.

However, since a memory circuit required to retain data also exists, it has conventionally been impossible to turn OFF a power supply for a chip containing a memory circuit which retains data during standby. For a memory circuit formed on a chip, especially an SRAM circuit, a circuit having a long gate length Lg and a large bit cell has been used inevitably such that the problem of a leakage current does not occur.

If a power shutdown function performed by a switch 55 for power shutdown is incorporated in each of various SRAM circuits except for the SRAM circuit which retains data during standby, as in the SRAM block shown in FIG. 18A, there is no probability of the occurrence of a leakage current. Since bit cells 50A each having a small gate length Lg can be implemented in the SRAM block having the power shutdown function, as shown in FIG. 18B, the bit cell area can be reduced.

Thus, the SRAM block which need not retain data and therefore contains the bit cells 50A each having a relatively small gate length Lg is disposed in a region of a chip where micro-patterning variations are large, as shown in FIG. 18A.

On the other hand, the SRAM block which should retain data and therefore contains the bit cells 50B each having a relatively large gate length Lg is disposed in a region of the chip where micro-patterning variations are small, as shown in FIG. 19A. In either case, the area of the chip can be reduced. This is because a power shutdown function need not be incorporated in the SRAM block containing the bit cells 50B.

Figure 20A:
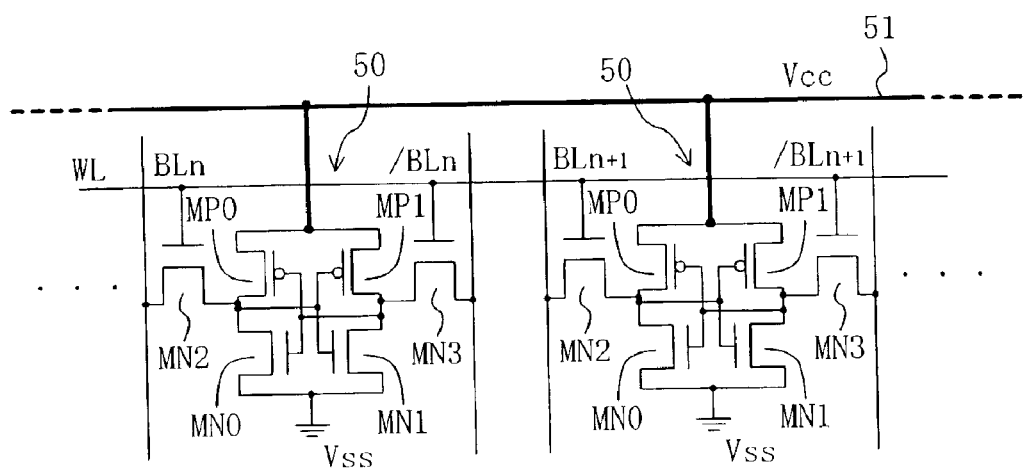
Figure 20B:
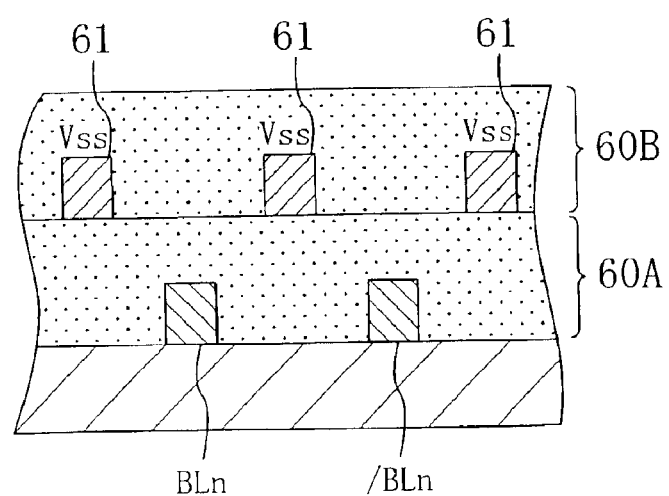

In the SRAM circuit which has a structure equal to that shown in FIG. 19A and should retain data during standby, wires (nodes) at different potentials are formed preferably in different wiring layers to reduce the probability of a short circuit occurring between the wires at different potentials, as shown in FIG. 20A. For example, bit lines BLn and complementary bit lines /BLn each composing the SRAM block are formed preferably in a first wiring layer 60A, while ground lines 61 are formed preferably in a second wiring layer 60B formed over the first wiring layer 60A, as shown in FIG. 20B.

Even if the SRAM block having a power shutdown function and the SRAM block not having a power shutdown function are formed on one chip, the area occupied by each of the bit cells 50A can be reduced.

In this case, if the error between the expected value based on the first OPC mask data and the expected finished size exceeds a tolerable value, the expected value of the pattern of the bit cells 50A can be changed easily based on the second layout design rule different from the first layout design rule.

Although EXAMPLE 3 has also described the SRAM blocks formed in the semiconductor integrated circuit device, the present invention is not limited to SRAM blocks.

EMBODIMENT 4

Referring to the drawings, EMBODIMENT 4 of the present invention will be described.

FIG. 21 shows the flow of a method for designing a semiconductor integrated circuit device according to EMBODIMENT 4 of the present invention.

If the difference between the expected value and the expected finished size, each of which is based on the first OPC mask data according to the first layout design rule, does not fall within the error tolerance for the standard value, each of EMBODIMENTS 1 to 3 described above has produced second OPC mask data by using the second layout design rule different from the first layout design rule.

If the difference between the first OPC mask data and the expected finished size each according to the first layout design rule does not fall within the error tolerance for the first standard value, each of EMBODIMENTS 4 to 6, which will be described below, sets a second standard value such that the finished size of the second OPC mask data falls within the error tolerance for the set second standard value.

First, in a layout-design-rule determining step ST10 shown in FIG. 21, a layout design rule to be used is determined selectively for a plurality of placement (layout) regions of one semiconductor substrate (chip) on each of which a design pattern composed of an element pattern and a wiring pattern is to be placed based on a physical dimension to be applied to the design pattern, a geometric feature therein, an electric specification therein, or a usage mode therein. It is to be noted one placement region does not extend between a plurality of functional blocks.

Next, in a first-layout-data producing step ST11, first layout data having a first expected value based on a first design rule is produced selectively for some of the plurality of placement regions.

Next, in a first-OPC-mask-data producing step ST12, the first layout data is optically corrected such that the expected finished size after fabrication of the first layout data falls within an error tolerance for the first standard value, whereby first OPC mask data composed of EB data is produced.

Next, in a first-OPC-mask-data determining step ST13, if the expected finished size after fabrication of the first layout data falls within the error tolerance for the standard value in each of the placement regions, the placement region is judged to be a within-tolerance region and the first OPC mask data is determined as mask data for exposure. However, the difference between the first expected value and the first expected finished size, each of which is based on the first layout design rule, does not necessarily fall within the error tolerance for the first standard value throughout the plurality of placement regions.

It is therefore determined in an out-of-tolerance-region determining step ST14 whether the plurality of placement regions include one in which the first OPC mask data does not fall within the error tolerance for the standard value, i.e., an out-of-tolerance region.

If there is an out-of-tolerance region, second layout data having a second expected value based on a second layout design rule different from the first layout design rule is produced in a second-layout-data producing step ST15 for the out-of-tolerance region.

Next, in a second-OPC-mask-data producing step ST16, second OPC mask data composed of EB data is produced by optically correcting the second layout data such that the difference between the second expected value and the expected finished size after fabrication, each of which is based on the second layout data, of the second layout data falls within an error tolerance for a second standard value.

Next, in a second-OPC-mask-data determining step ST17, if the expected finished size after fabrication of the second layout data falls within the error tolerance for the second standard value in the out-of-tolerance region, the out-oftolerance region is judged to be a within-tolerance region and the second OPC mask data is determined as mask data for exposure.

Meanwhile, in a third-layout-data producing step ST21, third layout data having a third expected value based on the second layout design rule is produced for each of regions different from the placement regions to which the first layout design rule has been applied.

Next, in a third-OPC-mask-data producing step ST22, the third layout data is optically corrected such that the expected finished size after fabrication of the third layout data falls within an error tolerance for a third standard value so that third OPC mask data composed of EB data is produced.

Next, in a third-OPC-mask-data determining step ST23, if the expected finished size after fabrication of the third layout data falls within the error tolerance for the third standard value in each of the placement regions, the placement region is judged to be a within-tolerance region and the third OPC mask data is determined as mask data for exposure. However, the difference between the third expected value and the expected finished size, each of which is based on the third layout design rule, does not necessarily falls within the error tolerance for the first standard value.

It is therefore determined in an out-of-tolerance-region determining step ST24 whether the plurality of placement regions include one in which the third OPC mask data does not fall within the error tolerance for the third standard value, i.e., an out-of-tolerance region.

If there is an out-of-tolerance region, fourth layout data having a fourth expected value based on the second layout design rule is produced in a fourth-layout-data producing step ST25 for the out-of-tolerance region.

Next, in a fourth-OPC-mask-data producing step ST26, fourth OPC mask data composed of EB data is produced by optically correcting the second layout data such that the difference between the fourth expected value and an expected finished size after fabrication, each of which is based on the fourth layout data, falls within the error tolerance for the third standard value.

Next, in a fourth-OPC-mask-data determining step ST27, if the expected finished size after fabrication of the fourth layout data falls within the error tolerance for the third standard value in the out-of-tolerance region, the out-of-tolerance region is judged to be a within-tolerance region and the fourth OPC mask data is determined as mask data for exposure.

Subsequently, mask data is produced by using the first to fourth OPC mask data sets each of which has been determined.

It is also possible to repeat the procedure by, e.g., producing another OPC mask data by changing each of the standard values if the difference between each of the OPC mask data sets produced for the out-of-tolerance region and the expected finished size after fabrication does not fall within the error tolerance for the corresponding standard value in the second-OPC-mask-data producing step ST16 or in the fourth-OPC-mask-data producing step ST26.

The following is examples of changing standard values for the physical dimensions to be applied depending on the geometric feature of the design pattern. The geometric features are the same as shown in FIG. 2.

EXAMPLE 1 OF EMBODIMENT 4

In EXAMPLE 1, a layout design rule for determining the physical dimension to be applied to "Bit Cell Area" is determined selectively based on "Longer-Side Direction of Quadrilateral" as the first geometric feature.

In SRAM blocks mounted on a semiconductor integrated circuit as shown in FIGS. 4A, 4B, and 5B, e.g., the respective gates 21 to 24 of the transistors composing the bit cell 11a of the first SRAM block 11 have their gate width directions coincident with the direction of the X axis on the wafer 1. If the OPC mask pattern when the respective gate-width directions of the gates 21 to 24 extend along the direction of the X axis falls within the first error tolerance, the bit cell area can eventually be set to 2.4 µm.

On the other hand, the respective gates 21 to 24 of the transistors composing the bit cell 12a of the second SRAM block 12 have their gate width directions coincident with the direction of the Y axis on the wafer 1. If the OPC mask pattern does not fall within the first error tolerance unless the area of the bit cell is adjusted to be larger than the area of the bit cell 11a, the area of the bit cell 12a is eventually set to 3.5 µm.

In performing, e.g., patterning for determining the respective gate lengths of the gates 21 to 24 in the first and second SRAM blocks 11 and 12, it is generally difficult to suppress patterning variations in a lithographic step and in an etching step in all directions, i.e., without specifying the direction to the direction of the X axis or the Y axis.

Since the first embodiment can retain required patterning accuracy by specifying the directions (gate width directions) in which the gates extend to the direction of the X axis in at least one of the plurality of functional blocks and preferentially optimizing the conditions for lithography in the specified direction, it can achieve an access time, a low leakage current, or the like required of the bit cell 11a.

In this case, the conditions for lithography in another direction deviated from the specified direction, e.g., in the direction of the Y axis have not been optimized. Therefore, patterning accuracy, i.e., the maximum size value of the design pattern should be sacrificed. For the bit cell 12a which is laid out to have the gate width directions oriented in a direction involving the sacrifice, i.e., only in the direction of the Y axis, the dimensions including the gate lengths and the gate-to-contact spacings are increased even at the expense of a reduction in the area occupied by the bit cell 12a such that the circuit elements are patterned exactly as designed.

In the case where the bit cell area is determined by directionality on the principal surface of the wafer 1, if the difference between the expected value based on the first OPC mask data and the expected finished size exceeds the error tolerance for the first standard value, the second OPC mask data can be produced by resetting the standard value to the second standard value different from the first standard value.

EXAMPLE 2 OF EMBODIMENT 4

In EXAMPLE 2, a layout design rule for determining the physical dimension to be applied to "Bit Cell Area" or "Gate Length" is determined selectively based on "Position" or "Region" of the first geometric feature.

Figure 22:
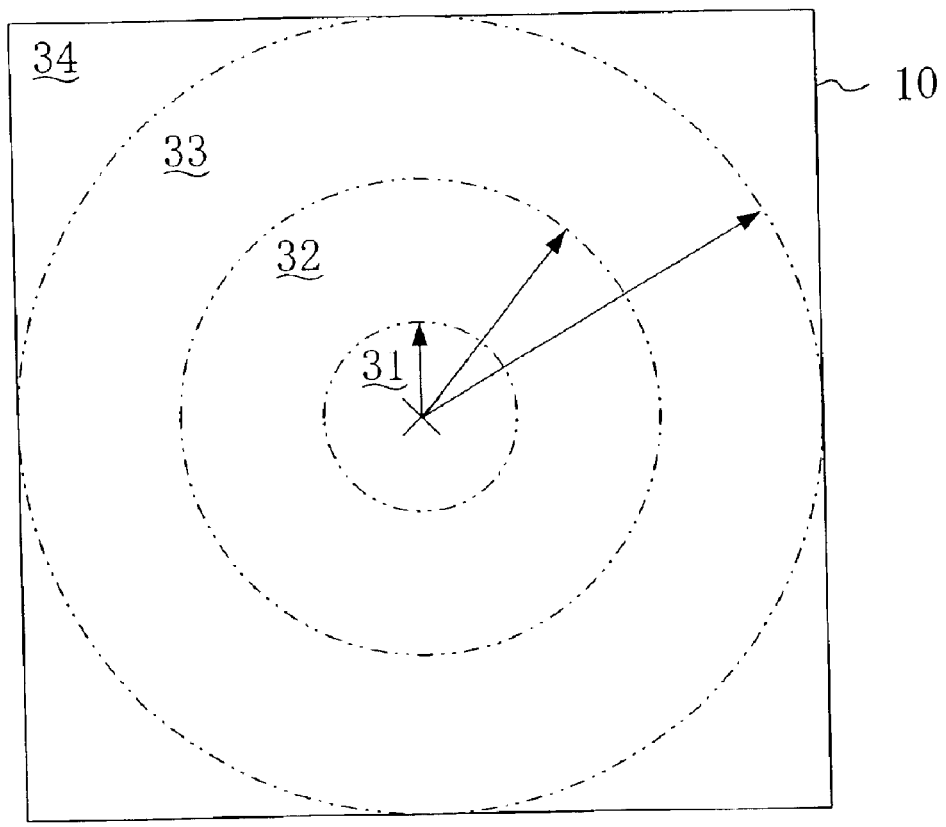
FIG. 22 is a diagrammatical plan view of a chip-like semiconductor integrated circuit device according to EXAMPLE 2 of EMBODIMENT 4 of the present invention.

FIG. 22 diagrammatically shows a plan structure of a chip-like semiconductor integrated circuit device according to EXAMPLE 2 of EMBODIMENT 4 of the present invention.

As shown in FIG. 22, the principal surface of the chip 10 is partitioned into first, second, third, and fourth regions 31, 32, 33, and 34 at every given radial distance from the center of the chip 10. Based on the sizes of the elements and the spacing between the individual parts of the elements to be applied to the first region 31 positioned at the central portion of the chip 10, e.g., the sizes of the elements or the parts thereof contained in the second to fourth regions 32 to 34 are increased gradually outwardly.

For example, the F value and the bit cell area in the first region 31 are assumed to be 1.0 and 2.4 $\mu m^2$, respectively. Since the relative design-rule sizes shown in FIG. 3 are directly proportional to the square of the F value, if the F value in the second region 32 is assumed to be 1.1, the bit cell area therein becomes 2.9 $\mu m^2$. If the F value in the third region 33 is assumed to be 1.2, the bit cell area therein becomes 3.46 $\mu m^2$. If the F value in the fourth region 34 is assumed to be 1.3, the bit cell area therein becomes 4.06 $\mu m^2$.

Thus, the conditions for lithography or etching have been optimized by setting priorities in accordance with the distances from the center of the chip 10. Conversely, if the conditions for lithography or the like are optimized in accordance with the distances from the outer region of the chip 10, i.e., from the fourth region 34 toward the first region 31, the F value in the first region 31 becomes highest among the F values in the first to fourth regions 31 to 34.

In another example, the gate length L in the first region 31 is assumed to be 0.15 $\mu m$ and the operating frequency of an SRAM circuit therein is assumed to be 160 MHz. In the second region 32, the gate length L and the operating frequency of the SRAM circuit are assumed to be 0.18 $\mu m$ and 80 MHz, respectively. In the third region 33, the gate length L and the operating frequency of the SRAM circuit are assumed to be 0.20 $\mu m$ and 40 MHz, respectively.

As stated previously, only one process condition has been used conventionally within one chip (wafer) so that the process condition is determined by the minimum condition in the chip 10. As a result, one type of bit cells each having a minimum size value have been formed conventionally on one chip.

By contrast, the present invention thus allows size variations on the chip 10 during micro-patterning to be complemented at a design stage by physical dimensions to be applied which are capable of suppressing the variations so that the area of the chip is reduced.

In the case where the bit cell area or the gate length is determined by the position on the principal surface of the wafer 1, if the difference between the expected value and the expected finished size, each of which is based on the first OPC mask data, exceeds the error tolerance for the first standard value, the second OPC mask data can be produced by resetting the standard value to the second standard value different from the first standard value.

Although EXAMPLE 2 has used the SRAM device as the semiconductor integrated circuit device, the present invention is not limited to an SRAM device.

EXAMPLE 3 OF EMBODIMENT 4

In EXAMPLE 3, a layout design rule for determining the physical dimension to be applied to "Relative Design-Rule Sizes" is determined selectively based on "Position" or "Region" which is the first geometric feature.

Figure 23:
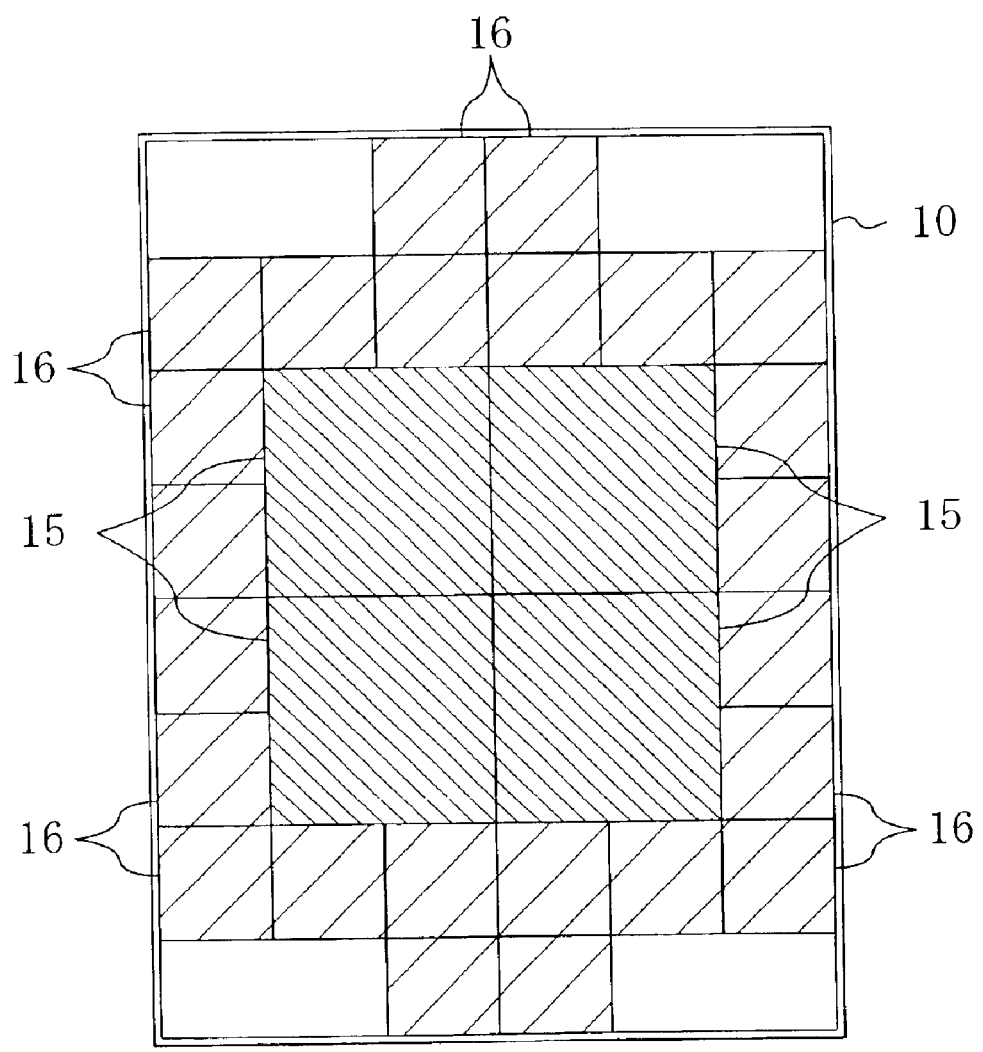
FIG. 23 is a diagrammatical plan view of a chip-like semiconductor integrated circuit device according to EXAMPLE 3 of EMBODIMENT 4.

FIG. 23 diagrammatically shows a plan structure of a chip-like semiconductor integrated circuit device according to EXAMPLE 3 of EMBODIMENT 4 of the present invention.

As shown in FIG. 23, a plurality of first functional blocks 15 are disposed at the central portion of the principal surface of the chip 10 and a plurality of second functional blocks 16 each occupying an area smaller than the area occupied by each of the first functional blocks 15 are disposed around the plurality of first functional blocks 15.

The following is the relationship between the respective sizes of the functional blocks 15 and 16 and a margin for tolerable micro-patterning variations.

(1) If the size of a block is large, as that of the first functional block 15, an absolute amount of variation in wiring resistance or wiring capacitance is large so that an operating margin for micro-patterning variations is small.

(2) If the size of a block is small, as that of the second functional block 16, an absolute amount of variation in wiring resistance or wiring capacitance is small so that an operating margin for micro-patterning variations is large.

If the magnitude of micro-patterning variation is dependent on the distance from the center of the chip 10, the second functional blocks 16 smaller in size are disposed preferentially on the peripheral region of the chip 10 where variations are large. On the other hand, the first functional block 15 larger in size are disposed preferentially on the central region of the chip 10 where variations are small.

By way of example, the F value in each of the first and second functional blocks 15 and 16 is assumed to be 1.0, while the respective areas occupied by the first block 15 and the second block 16 are assumed to be 15 $mm^2$ and 3 $mm^2$.

EXAMPLE 4 OF EMBODIMENT 4

In EXAMPLE 4, a layout design rule for determining the physical dimension to be applied to "Relative Design-Rule Sizes" or "Bit Cell Area" is determined selectively by "Dummy Pattern" which is the fourth geometric feature.

Figure 24:
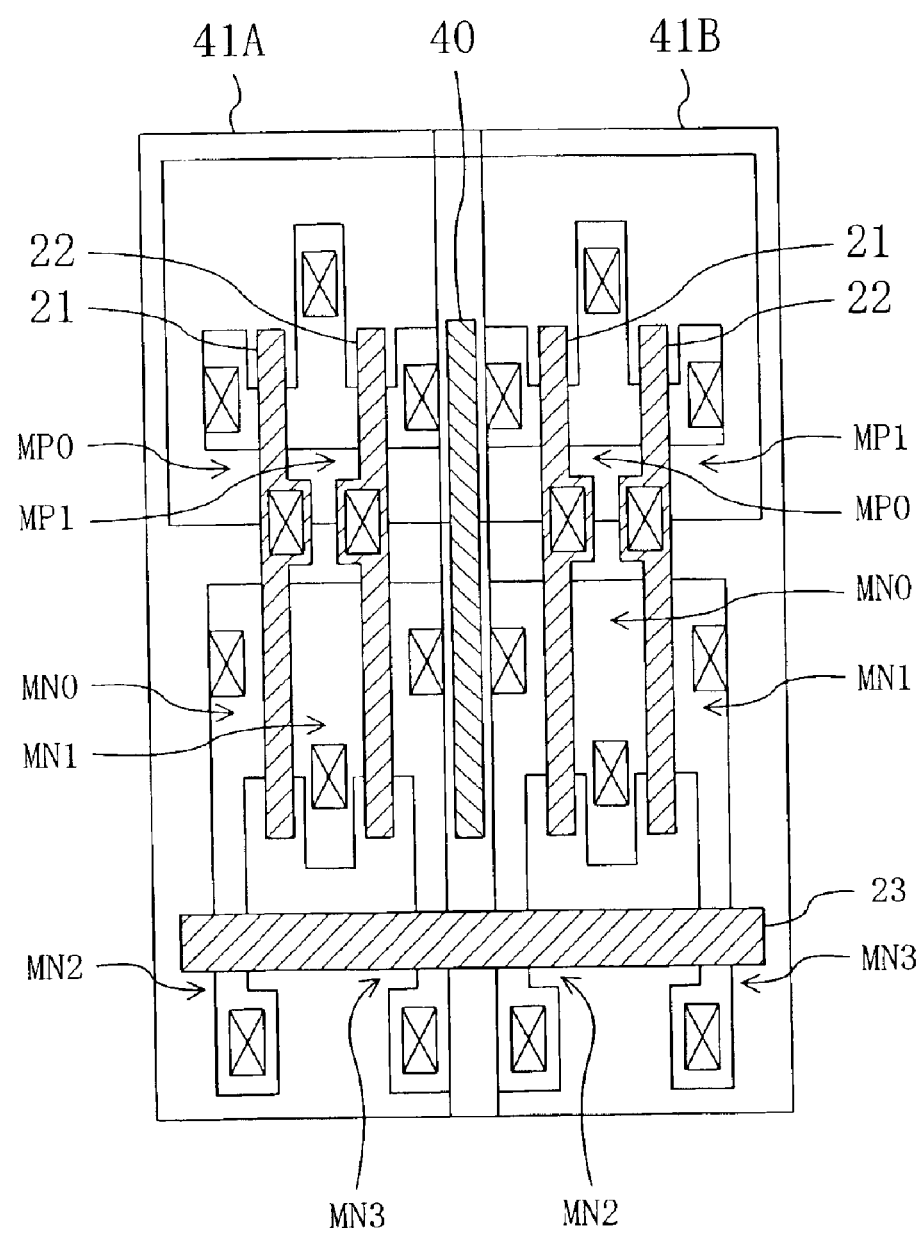
FIG. 24 is a plan view of a plurality of bit cells contained in an SRAM block formed in a semiconductor integrated circuit device according to EXAMPLE 4 of EMBODIMENT 4.
Figure 25:
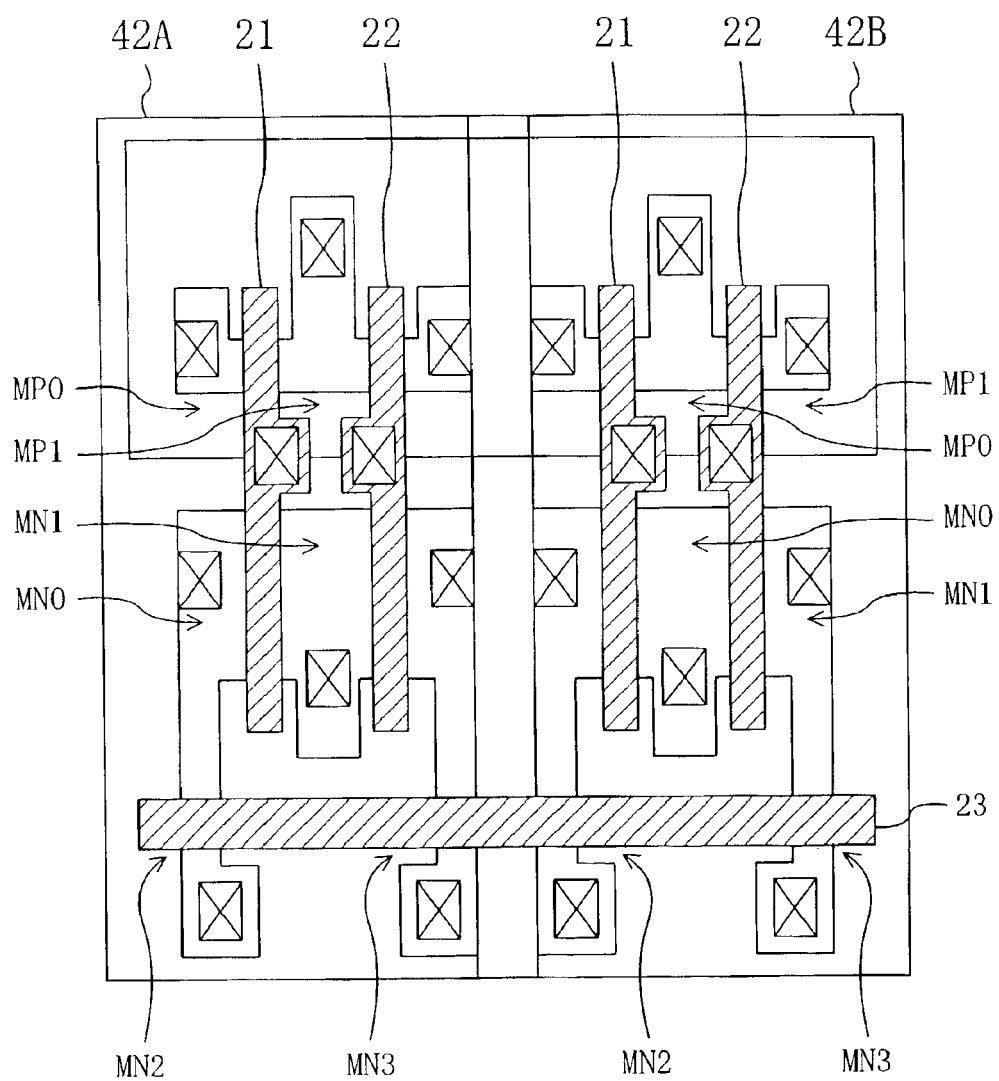
FIG. 25 is a plan view of a plurality of bit cells contained in an SRAM block formed in the semiconductor integrated circuit device according to EXAMPLE 4 of EMBODIMENT 4.

FIGS. 24 and 25 show a plan structure of a plurality of bit cells contained in SRAM blocks formed in a semiconductor integrated circuit device according to EXAMPLE 4 of EMBODIMENT 4 of the present invention.

As shown in FIG. 24, a dummy gate 40 is disposed between adjacent first and second bit cells 41A and 41B in parallel with each of first and second gates 21 and 22.

Each of first and second P-type load transistors MP0 and MP1 composing the first and second bit cells 41A and 41B has a gate length of 0.15 $\mu m$.

By contrast, the dummy gate 40 is not disposed between third and fourth bit cells 42A and 42B adjacent to each other, as shown in FIG. 25. Each of first and second P-type load transistors MP0 and MP1 composing the third and fourth bit cells 42A and 42B has a gate length of 0.18 $\mu m$.

Thus, not only the respective areas of the first and second bit cells 41A and 41B are reduced to be smaller than those of the third and fourth bit cells 42A and 42B but also the dummy pattern 40 is added as a second layout design rule to the first and second bit cells 41A and 41B. As a result, there may be cases where design is performed again such that an error tolerance for a new standard value is satisfied.

To increase an access speed in an SRAM device, it is generally required to reduce the gate lengths of transistors composing the SRAM device. To reduce the gate lengths, high-precision micro-patterning becomes necessary. Since the conditions for lithography and etching are optimized more easily in a region at a high layout density than in a region at a low layout density, the layout densities of the first and second bit cells 41A and 41B can be increased by disposing a dummy pattern, e.g., the dummy gate 40 in a region where no design pattern exists.

In the case where the bit cell area or the layout density is determined by the dummy pattern, if the difference between the expected value based on the first OPC mask data and the expected finished size exceeds the error tolerance for the first standard value, the second OPC mask data can be produced by resetting the standard value to the second standard value different from the first standard value.

Although EXAMPLE 4 has described the SRAM blocks formed in the semiconductor integrated circuit device, the present invention is not limited to SRAM blocks.

EXAMPLE 5 OF EMBODIMENT 4

In EXAMPLE 5, a layout design rule for determining the physical dimension to be applied to "Space (Separation)" of "Relative Design-Rule Sizes" is determined selectively by "Layout Density" which is the second geometric feature and by "Leakage Current" as one of the electric specification characteristics.

Figure 26A:
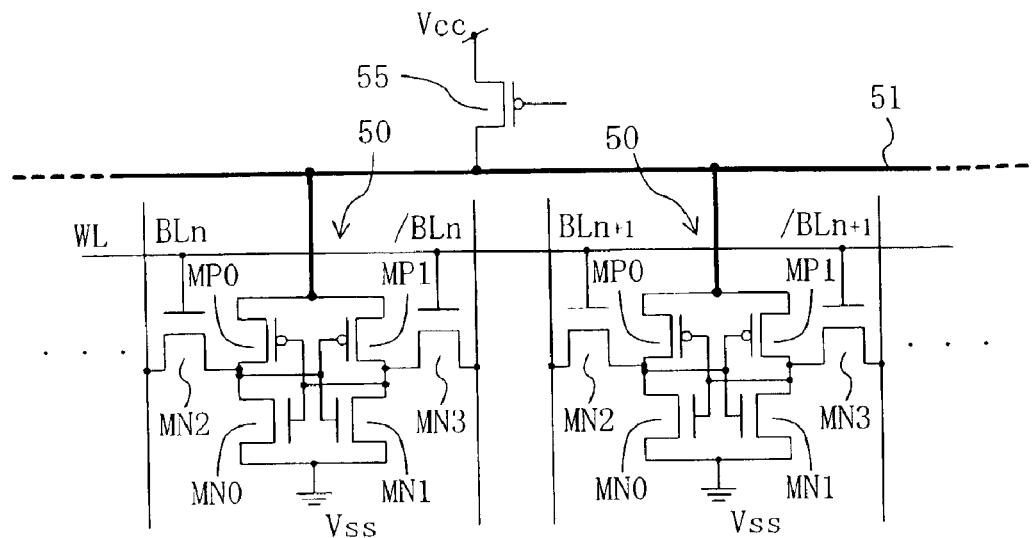
Figure 26B:
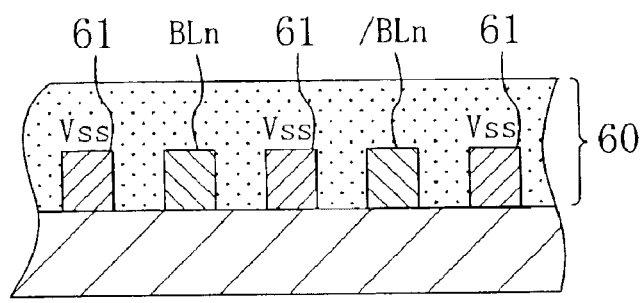
Figure 26C:
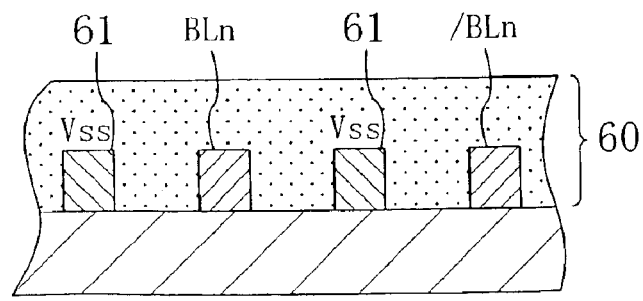
Figure 27:
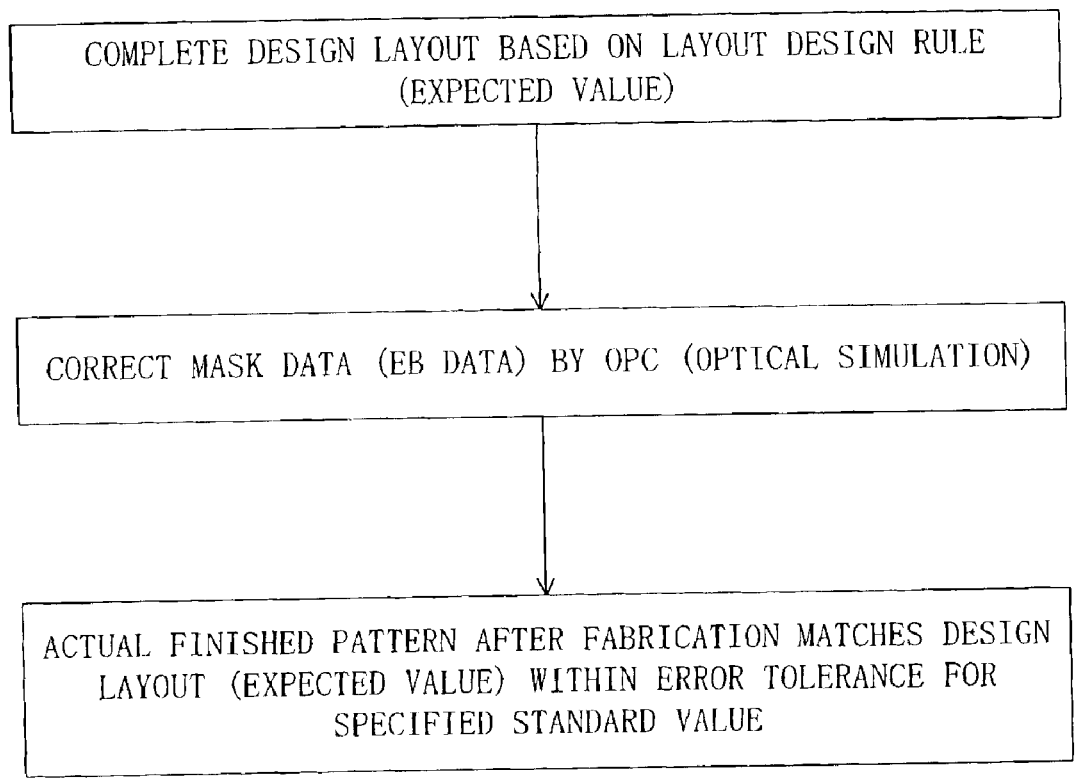
FIG. 27 is a flow chart illustrating a conventional method for designing a semiconductor integrated circuit device.

FIGS. 26A to 26C show an SRAM block formed in a semiconductor integrated circuit device according to EXAMPLE 5 of EMBODIMENT 4 of the present invention, of which FIG. 26A shows a circuit structure of the SRAM block in which power shutdown control is performed and FIGS. 26B and 26C show cross-sectional structures of bit lines and ground lines in the SRAM block.

In a typical SRAM device, a bit line BLn and a complementary bit line /BLn connected to the respective sources of first and second access transistors MN2 and MN3 are precharged to a power supply voltage Vcc so that, if a line adjacent to the bit line BLn or to the complementary bit line /BLn is a line having a potential different from a potential on the bit line BLn or the complementary bit line /BLn, e.g., a ground line to which a ground voltage Vss is applied, a defect at a design stage or during fabrication may cause a short circuit between the adjacent lines. This causes the problem that a leakage current flows between the bit line BLn or the complementary bit line /BLn and the ground line.

The specification for the bit cell 50 shown in FIG. 26A is such that data need not be retained during standby. Accordingly, a power shutdown switch 55 is provided between a power supply for supplying a power supply voltage Vcc to the common source of first and second P-type load transistors MP0 and MP1 and a power supply line 51. The power shutdown switch 55 is turned OFF during standby so as not to supply the power supply voltage Vcc to the power supply line 51. On the other hand, the power shutdown switch 55 is turned ON during operation so as to supply the power supply voltage Vcc to the power supply line 51.

In an SRAM block in which the occurrence of a leakage current during standby is allowed, e.g., the spacings between the bit lines BLn and /BLn formed in one wiring layer 60 and ground lines 61 are relatively reduced so that the area occupied by the bit cell 50 is reduced, as shown in FIG. 26B.

In an SRAM block in which the occurrence of a leakage current during standby is not allowed, on the other hand, the spacings between the bit lines BLn and /BLn and the ground lines 61 are relatively increased at the expense of the area occupied by the bit cell 50, as shown in FIG. 26C.

In the case where an amount of leakage current suppressed is determined by a layout density (wire spacing), if the difference between the expected value and the expected finished size, each of which is based on the first OPC mask data, exceeds the error tolerance for the first standard value, the second OPC mask data can be produced by resetting the standard value to the second standard value different from the first standard value.

Although EXAMPLE 5 has described the SRAM block formed in the semiconductor integrated circuit device, the present invention is not limited to an SRAM block.

EXAMPLE 6 OF EMBODIMENT 4

In EXAMPLE 6, a layout design rule for determining the physical dimension to be applied to "Relative Design-Rule Sizes" and to "Bit Cell Area" is determined selectively by "Region" which is the first geometric feature.

As shown in FIG. 7, the principal surface of a wafer 1 is partitioned into first and second regions 1a and 1b at every given radial distance from the center of the chip 10.

For example, the area of a first chip 10A formed in the first region 1a positioned at the center of the wafer 1 is set to 50 mm$^2$ by assuming that the F value is 1.0 and the area of a second chip 10B formed in the second region 1b positioned on the periphery of the wafer 1 is set to 70 mm$^2$ by assuming that the F value is 1.2.

Thus, the standard value for the difference between the expected value and the expected finished size, each of which is based on the OPC mask data, is changed depending on the distance from the center of the wafer 1.

Further, the area of a bit cell in a memory circuit formed on the first chip 10A is set to, e.g., 2.4 $\mu$m$^2$ and the area of a bit cell in a memory circuit formed on the second chip 10B is set to, e.g., 3.5 $\mu$m$^2$.

Thus, EXAMPLE 6 considers the shrinkage rate of the wafer and adjusts the area of the first chip 10A and the area of the bit cell in the first region 1a at which the shrinkage rate is relatively low to be smaller than the area of the second chip 10B and the area of the bit cell in the second region 1b at which the shrinkage rate is relatively high, thereby achieving miniaturization.

In EXAMPLE 6, therefore, mask data differs depending on the distance from the center of the wafer 1.

EXAMPLE 7 OF EMBODIMENT 4

By way of example, a description will be given herein below to the case where "Region", which is the first geometric feature, is applied to "Relative Design Rule Sizes" which is the first category of the physical dimensions to be applied.

In EXAMPLE 7 also, a layout design rule for determining physical dimensions to be applied to "Relative Design Rule" is determined selectively based on "Region" which is the second geometric feature.

As shown in FIG. 8, the principal surface of a wafer 1 is partitioned into first and second regions 1a and 1b at every given radial distance from the center of the chip 10.

In one example, the area of a first chip 10C formed in the first region 1a positioned at the center of the wafer 1 is set to 150 mm$^2$ by assuming that the F value is 1.0 and the area of a second chip 10D formed in the second region 1b positioned on the periphery of the wafer 1 is set to 30 mm$^2$ without changing the F value.

Further, EXAMPLE 7 places the first chip 10C in which a wiring length is increased by a relatively large chip area and therefore a timing margin is reduced on the center portion of the wafer 1.

In another example, the gate length Lg of a transistor formed on the first chip 10C contained in the first region 1a of the wafer 1 is set to 0.15 $\mu$m$^2$ and the gate length Lg of a transistor formed on the second chip 10D contained in the second region 1b of the wafer 1 is set to 0.18 $\mu$m$^2$.

Thus, the standard value for the difference between the expected value and the expected finished size, each of which is based on the OPC mask data, is changed depending on the distance from the center of the wafer 1.

In EXAMPLE 7, therefore, mask data differs depending on the distance from the center of the wafer 1 even if one layout design rule is used.

EXAMPLE 8 OF EMBODIMENT 4

By way of example, a description will be given herein below to the "Configuration", which is the fifth geometric feature, i.e., to the configuration of a base composed of a semiconductor onto which the design pattern is to be transferred.

In EXAMPLE 8, a layout design rule for determining physical dimensions to be applied to "Relative Design-Rule Sizes" is determined selectively based on the configuration of the base composed of a semiconductor as the fifth geometric feature.

FIG. 9A shows a plate-like (chip-like) first base 101 used normally, which is a so-called semiconductor substrate. FIG. 9B shows a rectangular parallelepiped second base 102. FIG. 9C shows a cylindrical third base 103.

As shown in FIGS. 9D and 9E, if the focal depth in the lithographic step or the etch rate has the dependence, the standard value for the difference between the expected value and the expected finished size, each of which is based on the OPC mask data, is changed depending on the configuration of the base composed of a semiconductor.

Since not only the layout design rule but also the bit cell area in the memory circuit should be changed, mask data are different at the flat surface of the first base 101, at the flat side surface of the second base 102, at the bottom surface of each of the second and third bases 102 and 103, and at the cylindrical side surface of the third base 103.

EMBODIMENT 5

Referring to the drawings, EMBODIMENT 5 of the present invention will be described.

In EMBODIMENT 5, a description will be given to the case where a standard value for the difference between the expected value and the expected finished size, each of which is based on the OPC mask data, is changed depending on a required electric specification and a designing method for implementing the required electric specification. The categories of the electric specification characteristics are as shown in FIG. 10.

EXAMPLE 1 OF EMBODIMENT 5

In EXAMPLE 1, a layout design rule for determining a physical dimension to be applied to "Nodes at Different Potentials" is determined selectively by "Leakage Current" which is the first electric specification.

For example, in the SRAM block provided with the leakage suppressing circuit 54 shown in FIGS. 11A and 11B mentioned above, the area occupied by the bit cell 50A can be reduced and the operating speed can be increased by relatively reducing the gate length Lg of each of the gates 21 to 23 composing the bit cell 50A. Since a leakage current flowing between wires need not be considered, the bit lines BLn and /BLn and the ground lines 61 can be disposed in relatively dense relation, as shown in FIG. 26B.

In the SRAM block not provided with the leakage suppressing circuit 54 shown in FIGS. 12A and 12B, on the other hand, the gate length Lg of each of the gates 21 to 23 composing the bit cell 50B is relatively increased. For further suppression of a leakage current flowing in the SRAM block shown in FIG. 20B, the bit lines BLn and /BLn and the ground lines 61 which are at different potentials during standby may be formed in the different wiring layers 60A and 60B, respectively.

If the error between the first OPC mask data and the expected value is large as between the bit cells 50A and 50B or between the wiring layer 60 and the first wiring layer 60A, therefore, the second OPC mask data can be produced by resetting the standard value to the second standard value different from the first standard value. Specifically, if the error between the first OPC mask data and the expected value exceeds the first standard value, the first standard value can be changed to the second standard value which suppresses the leakage current as the electric specification characteristic.

EXAMPLE 2 OF EMBODIMENT 5

In EXAMPLE 2, a layout design rule for determining a physical dimension to be applied is determined selectively by "Operating Speed (clock frequency)" which is the first electric specification characteristic.

A designing method assumed in EXAMPLE 2 is feedback control over a power supply voltage, a substrate voltage, or the like performed by a monitor circuit such that a clock frequency serving as a basis for circuit operation and the frequency of the monitor circuit have a specified relationship therebetween, such as a phase locked loop (PLL).

Even if the gate lengths of transistors become excessively short or long due to micro-patterning variations and a signal delay time varies, the monitor circuit capable of controlling a power supply voltage or a substrate voltage can correct an amount of delay in signal propagation time.

For example, in the SRAM block having the leakage suppressing circuit 54 shown in FIGS. 11A and 11B mentioned above, even if a leakage current becomes more likely to flow as a result of relatively reducing the gate length Lg of each of the gates composing the bit cell 50A to increase the operational speed, the provision of the leakage suppressing circuit 54 can also suppress an increase in leakage current during standby.

For a circuit block having a delay control circuit, EXAMPLE 2 reduces the gate length and thereby uses a logic cell which performs a high-speed operation with large speed variations and has a small cell area. For a logic block not having a delay control circuit, on the other hand, EXAMPLE 2 increases the gate length and thereby allows the use of a logic cell having small speed variations and a large cell area.

If the error between the first OPC mask data and the expected value is large, therefore, second OPC mask data can be produced by resetting the standard value to the second standard value different from the first standard value through the provision or non-provision of a monitor circuit, a delay control circuit, or a leakage suppressing circuit. Specifically, if the error between the first OPC mask data and the expected value exceeds the first standard value, the first standard value can be changed to the second standard value which satisfies the operating speed as the electric specification characteristic.

EXAMPLE 3 OF EMBODIMENT 5

In EXAMPLE 3, a layout design rule for determining a physical dimension to be applied is determined selectively by "Delay Control" using variations in the number of wiring layers used in a layout which allows the determination of "Operating Speed" as the second electric specification.

The present invention is characterized in that the gate length is relatively increased under the condition in which the gate length varies greatly. This lowers the operating speeds of the transistors and increases the cell area, but the use of multilayer wiring compensates for an increase in cell area. Under the condition in which gate length variations are small, on the other hand, the gate length is relatively reduced. This satisfies a requested speed and achieves a reduced cell area.

As described in EMBODIMENT 2, however, the layout of SRAM blocks is normally performed in four wiring layers at the maximum such that a wire providing a connection between other functional blocks extends over the SRAM block.

If the error between the first OPC mask data and the expected value is large, therefore, the second OPC mask data can be produced by resetting the standard value to the second standard value different from the first standard value by changing the number of layout wiring layers. Specifically, if the error between the first OPC mask data and the expected value exceeds the first standard value, the first standard value can be changed to the second standard value which satisfies the operating speed as the electric specification characteristic.

EXAMPLE 4 OF EMBODIMENT 5

In EXAMPLE 4, a layout design rule for determining a physical dimension to be applied is determined selectively by "Synchronous/Asynchronous Design" which allows the determination of "Timing" as the third electric specification.

As described above, the functional blocks designed synchronously and the functional blocks designed asynchronously exist in mixed relation on one chip. If the functional blocks designed asynchronously are disposed in the region of the chip where micro-patterning variations are large and the functional blocks designed synchronously are disposed in the region of the chip where micro-patterning variations are small, therefore, fluctuation in timing allowance value when the variations are considered can be suppressed.

If the error between first OPC mask data and the expected value is large, therefore, second OPC mask data can be produced by resetting the standard value to the second standard value different from the first standard value by designing circuit blocks synchronously or asynchronously.

EXAMPLE 5 OF EMBODIMENT 5

In EXAMPLE 5, a layout design rule for determining a physical dimension to be applied is determined selectively by "Gate Size" of each of the transistors in a delay circuit which allows the determination of "Timing" as the third electric specification.

Because of large micro-patterning variations across the chip, in a delay circuit which should inevitably be disposed in a region where variations in gate width are large, the influence of the variations is reduced by increasing the gate width even at the expense of a circuit area. In the case where the delay circuit can be disposed in a region where variations in gate width are small, however, the gate width can be reduced by giving a higher priority to a reduction in circuit area.

If the error between first OPC mask data and the expected value is large, therefore, second OPC mask data can be produced by resetting the standard value to the second standard value different from the first standard value by adjusting the gate width used in the delay circuit. Specifically, if the error between the first OPC mask data and the expected value exceeds the first standard value, the first standard value can be changed to the second standard value which satisfies the gate width as the electric specification characteristic.

EXAMPLE 6 OF EMBODIMENT 5

In EXAMPLE 6, a layout design rule for determining a physical dimension to be applied is determined selectively by a layout for adjusting "Distance from Clock Driver" which allows the determination of "Timing" as the third electric specification.

In general, a plurality of clock drivers are placed at positions on a chip as close as possible to the regions to which a clock signal is supplied. Although the placement of a larger number of clock drivers is advantageous to a design margin in timing design, the area is increased thereby disadvantageously through the tradeoff between the number of clock drivers placed and a circuit area.

If the magnitude of micro-patterning variation has dependence on the distance from the center of the chip, EXAMPLE 6 allows the distance from each of the clock drivers to the corresponding one of the regions to which a clock is supplied to have a distribution dependent on the distance from the center of the chip, thereby reducing variations in timing allowance value.

If the error between first OPC mask data and the expected value is large, therefore, second OPC mask data can be produced by resetting the standard value to the second standard value different from the first standard value by using the layout for adjusting the distance from the clock driver. Specifically, if the error between the first OPC mask data and the expected value exceeds the first standard value, the first standard value can be changed to the second standard value which satisfies the distance from the clock driver as the second electric specification characteristic.

EXAMPLE 7 OF EMBODIMENT 5

In EXAMPLE 7, a layout design rule for determining a physical dimension to be applied is determined selectively depending on the presence or absence of "Memory Function", i.e., the redundancy function which is the fourth electric specification.

If the effective DD value changes depending on the distance from the center of the chip, it is also possible to determine whether or not redundancy circuits are provided on the chip depending on the distance from the center thereof.

A description will be given herein below to relationships observed between the area occupied by each of the bit cells and the DD value.

In a first relationship, the DD value is increased if the area occupied by the bit cell is reduced. This is because, for a reduced area occupied by the bit cell, the dimensions of the individual parts of a design pattern, i.e., the gate, the source, the drain, and the like should inevitably be reduced so that the spacing between the wires or the elements is also reduced and the probability of a fault occurring under the influence of a minor defect or pattern shift becomes high.

In a second relationship, the area occupied by the bit cell varies with the number of contacts provided in the bit cell (determination of the number of contacts) and the DD value also varies with the number of contacts provided in the bit cell.

In the case where two contacts are provided on each of the source and drain as in the first bit cell 70A shown in FIG. 6A, even if one of the two contacts becomes faulty, the entire bit cell does not become faulty.

The comparison and consideration of the first and second relationships described above allows selective use of the structures of the contacts depending on the presence or absence of the redundancy function.

If the error between the first OPC mask data and the expected value is large, therefore, the second OPC mask data can be produced by resetting the standard value to the second standard value different from the first standard value through the provision or non-provision of the memory circuit with the redundancy function. Specifically, if the error between the first OPC mask data and the expected value exceeds the first standard value, the first standard value can be changed to the second standard value which satisfies a request on the provision or non-provision of the redundancy function as the electric specification characteristic.

EMBODIMENT 6

Referring to the drawings, EMBODIMENT 6 of the present invention will be described.

In EMBODIMENT 6, a description will be given to the case where the standard value for the difference between the expected value and the expected finished size, each of which is based on the OPC mask data, is changed in accordance with a required specification which differs depending on the usage mode thereof. The categories of the usage modes are as shown in FIG. 16.

EXAMPLE 1 OF EMBODIMENT 6

In EXAMPLE 1, a layout design rule for determining a physical dimension to be applied is determined selectively in accordance with the usage mode of "One Bit Fault is Tolerable (except for consecutive bit faults)", which is characteristic of the first usage mode.

As described above, in a frame buffer memory used merely for display, not as a frame buffer used for a digital arithmetic operation, e.g., even if all the bits representing one pixel are faulty, they are unrecognizable by human eyes and therefore substantially tolerable. There is little necessity to incorporate a redundancy function into such a frame buffer memory. Even if it is incorporated, the redundancy function may be provided appropriately in a region where micro-patterning variations are large.

Specifically, a frame buffer for an application which requires a larger number of pixels rather than a smaller number of point defects, such as the first SRAM block 19 shown in FIG. 17B, needs a relatively large memory capacity so that a reduction in bit cell area is required. In addition, a redundancy function need not be incorporated therein since a point defect is tolerated.

In an SRAM block in which a memory capacity need not be increased but a defect (error) is not tolerated because of its use for a digital arithmetic operation, such as the second SRAM block 20, on the other hand, the probability of a defect is reduced appropriately by relatively increasing the bit cell area.

Thus, the first SRAM block 19 which has a large capacity, exhibits a high degree of integration, and tolerates a point defect is disposed in a region of the chip 10 where micro-patterning variations are relatively large. By contrast, the second SRAM block 20 which has a smaller capacity than the first SRAM block 19, exhibits a lower degree of integration than the first SRAM block 19, and does not tolerate a point defect is disposed in a region of the chip 10 where variations are relatively small. This resultantly reduces the area of the chip 10.

If the error between the first OPC mask data and the expected value is large, therefore, the second OPC mask data can be produced by resetting the standard value to the second standard value different from the first standard value by determining whether or not one bit fault should be tolerated. Specifically, if the error between the first OPC mask data and the expected value exceeds the first standard value, the first standard value can be changed to the second standard value which satisfies "One Bit Fault is Tolerable" as the required specification which differs depending on usage mode thereof.

EXAMPLE 2 OF EMBODIMENT 6

In EXAMPLE 2, a layout design rule for determining a physical dimension to be applied is determined selectively in accordance with the usage mode of "Retention/Non-Retention of Data during Standby", which is characteristic of the second usage mode.

To use a semiconductor integrated circuit device having a memory circuit for mobile applications, a leakage current in the memory circuit should be suppressed during standby. If the power supply is turned OFF during standby, therefore, the leakage current can surely be suppressed.

However, since a chip containing a memory circuit which retains data during standby cannot be turned OFF, each of conventional SRAM circuits formed on a chip has used a circuit having a large gate length Lg such that the problem of leakage current does not occur.

If EXAMPLE 2 incorporates a power shutdown function performed by a switch 55 for power shutdown in each of SRAM circuits as shown in FIG. 18A except for the SRAM circuit which retains data during standby, there is no probability of the occurrence of a leakage current. Since bit cells 50A each having a small gate length Lg can be implemented in the SRAM block having the power shutdown function, as shown in FIG. 18B, the bit cell area can be reduced.

Thus, the SRAM block which need not retain data and therefore contains the bit cells 50A each having a relatively small gate length Lg is disposed in a region of a chip where micro-patterning variations are large, as shown in FIG. 18A.

On the other hand, the SRAM block which should retain data and therefore contains the bit cells 50B each having a relatively large gate length Lg is disposed in a region of the chip where micro-patterning variations are small, as shown in FIG. 19A. In either case, the area of the chip can be reduced.

In the SRAM circuit which has a structure equal to that shown in FIG. 19A and should retain data during standby, wires (nodes) at different potentials are formed preferably in different wiring layers to reduce the probability of a short circuit occurring between the wires at different potentials, as shown in FIG. 20A. For example, bit lines and complementary bit lines BLn and /BLn composing the SRAM block are formed preferably in a first wiring layer 60A, while ground lines 61 are formed preferably in a second wiring layer 60B formed over the first wiring layer 60A, as shown in FIG. 20B.

Even if the SRAM block having a power shutdown function and the SRAM block not having a power shutdown function are formed on one chip, the area occupied by each of the bit cells 50A can be reduced.

If the error between the first OPC mask data and the expected value is large, therefore, the second OPC mask data can be produced by resetting the standard value to the second standard value different from the first standard value by satisfying the required specification of "Retention/Non-Retention of Data in Memory Circuit during Standby". Specifically, if the error between the first OPC mask data and the expected value exceeds the first standard value, the first standard value can be changed to the second standard value which satisfies "Retention/Non-retention of Data" as the required specification which differs depending on usage mode thereof.

What is claimed is:

1. A method for designing a semiconductor integrated circuit device, the method comprising:
   a first step of producing, for a plurality of placement regions on each of which a design pattern is to be placed, first layout data having a first expected value based on a first layout design rule;
   a second step of producing, if a difference between the first expected value and an expected finished size after fabrication of the first layout data falls within a first predetermined error tolerance, first OPC data by correcting the first layout data;
   a third step of producing, if the plurality of placement regions include an out-of-tolerance region for which the first OPC data falling outside the first predetermined error tolerance, second layout data having a second expected value for only the out-of-tolerance region based on a second layout design rule;
   a fourth step of producing second OPC data by correcting the second layout data such that an expected finished size after fabrication of the second layout data falls within a second predetermined error tolerance; and
   a fifth step of producing mask data by using the first OPC data and the second OPC data, wherein:
   the first layout design rule is different from the second layout design rule, and
   the first layout data is different from the second layout data.

2. The method of claim 1, wherein the plurality of placement regions are provided on one semiconductor substrate, said method further comprising the step of:
   prior to the first step, dividing a layout design rule in each of the placement regions into a plurality of layout design rules in accordance with a geometric condition placed on the design pattern on the semiconductor substrate, wherein
   the first step includes the step of selecting the first layout design rule from among the plurality of layout design rules and the third step includes the step of selecting the second layout design rule from among the plurality of layout design rules.

3. The method of claim 1, wherein the plurality of placement regions are provided on one base made of a semiconductor, said method further comprising the step of:
   prior to the first step, dividing a layout design rule in each of the placement regions into a plurality of layout design rules in accordance with an outer configuration of the base, wherein
   the first step includes the step of selecting the first layout design rule from among the plurality of layout design rules and
   the third step includes the step of selecting the second layout design rule from among the plurality of layout design rules.

4. The method of claim 1, the method further comprising:
   prior to the first step, the step of dividing a layout design rule in each of the placement regions into a plurality of layout design rules in accordance with different finished sizes resulting from a required electric specification and a method for implementing the required electric specification, wherein
   the first step includes selecting the first layout design rule from among the plurality of layout design rules and
   the third step includes selecting the second layout design rule from among the plurality of layout design rules.

5. The method of claim 1, further comprising:
   prior to the first step, dividing a layout design rule in each of the placement regions in accordance with a required specification which differs depending on a usage mode of the semiconductor integrated circuit device, wherein the
   first step includes selecting the first layout design rule from among the plurality of layout design rules and
   the third step includes selecting the second layout design rule from among the plurality of layout design rules.

6. A method for designing a semiconductor integrated circuit device, the method comprising:
   a first step of producing, for a plurality of placement regions on each of which a design pattern is to be placed, first layout data having a first expected value based on a first layout design rule;
   a second step of producing, if a difference between the first expected value and an expected finished size after fabrication of the first layout data falls within a first predetermined error tolerance, first OPC data by correcting the first layout data;
   a third step of producing, if the plurality of placement regions include an out-of-tolerance region for which the first OPC data falling outside the first predetermined error tolerance, second OPC data by correcting the first layout data in only the out-of-tolerance region such that the corrected first layout data falls within a second predetermined error tolerance; and
   a fourth step of producing mask data by using the first OPC data and the second OPC data, wherein:
   the first layout design rule is different from the second layout design rule, and
   the first layout data is different from the second layout data.

7. The method of claim 6, the method assuming that the plurality of placement regions are provided on one semiconductor substrate and further comprising the step of:
   prior to the first step, dividing a predetermined value in each of the placement regions into a plurality of predetermined values in accordance with a geometric condition placed on the design pattern on the semiconductor substrate, wherein
   the first step includes selecting the first predetermined value from among the plurality of predetermined values and
   the third step includes selecting the second predetermined value from among the plurality of predetermined values.

8. The method of claim 6, the method assuming that the plurality of placement regions are provided on one base composed of a semiconductor and further comprising the step of:
   prior to the first step, dividing a predetermined value in each of the placement regions into a plurality of predetermined values in accordance with an outer configuration of the base, wherein the first step includes selecting the first predetermined value from among the plurality of predetermined values and the third step includes selecting the second predetermined value from among the plurality of predetermined values.

9. The method of claim 6, the method further comprising the step of:

prior to the first step, dividing a predetermined value in each of the placement regions into a plurality of predetermined values in accordance with different finished sizes resulting from a required electric specification and a designing method for implementing the required electric specification, wherein the first step includes selecting the first predetermined value from among the plurality of predetermined values and the third step includes selecting the second predetermined value from among the plurality of predetermined values.

10. The method of claim 6, further comprising the step of:

prior to the first step, dividing a predetermined value in each of the placement regions into a plurality of predetermined values in accordance with a required specification which differs depending on a usage mode of the semiconductor integrated circuit device, wherein the first step includes selecting the first predetermined value from among the plurality of predetermined values and the third step includes selecting the second predetermined value from among the plurality of predetermined values.

* * * * *